United States Patent
Kokubo et al.

(10) Patent No.: US 6,926,751 B2
(45) Date of Patent: Aug. 9, 2005

(54) CONDUCTIVE METAL PARTICLES, CONDUCTIVE COMPOSITE METAL PARTICLES AND APPLIED PRODUCTS USING THE SAME

(75) Inventors: Terukazu Kokubo, Tokyo (JP); Naoki Yanadori, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/661,523

(22) Filed: Sep. 15, 2003

(65) Prior Publication Data

US 2004/0079193 A1 Apr. 29, 2004

Related U.S. Application Data

(62) Division of application No. 09/961,323, filed on Sep. 25, 2001, now Pat. No. 6,663,799.

(30) Foreign Application Priority Data

Sep. 29, 2000 (JP) ........................................ 2000-300028

(51) Int. Cl.$^7$ ................................................. B22F 1/00
(52) U.S. Cl. ........................ 75/255; 428/570; 252/513; 252/514
(58) Field of Search ............................ 75/255; 428/403, 428/570; 252/513, 514, 512, 515

(56) References Cited

U.S. PATENT DOCUMENTS

| | | | |
|---|---|---|---|
| 3,983,075 A | | 9/1976 | Marshall et al. |
| 4,450,188 A | * | 5/1984 | Kawasumi ................... 427/217 |
| 4,455,167 A | | 6/1984 | Osborn |
| 4,579,882 A | | 4/1986 | Kanbe et al. |
| 4,600,604 A | | 7/1986 | Siuta |
| 4,687,597 A | | 8/1987 | Siuta |
| 4,711,814 A | * | 12/1987 | Teichmann ................... 428/403 |
| 4,729,809 A | | 3/1988 | Dery et al. |
| 4,776,980 A | | 10/1988 | Ruffini |
| 4,828,613 A | * | 5/1989 | Hoshino et al. ............. 420/460 |
| 4,833,033 A | * | 5/1989 | Sannohe et al. ............. 428/407 |
| 4,857,233 A | * | 8/1989 | Teichmann et al. ......... 252/513 |
| 4,944,797 A | | 7/1990 | Kemp et al. |
| 5,068,150 A | | 11/1991 | Nakamura et al. |
| 5,180,513 A | | 1/1993 | Durand |
| 5,584,908 A | | 12/1996 | Scheie |
| 5,968,225 A | * | 10/1999 | Ishii et al. ..................... 75/255 |
| 6,036,839 A | | 3/2000 | Kohut et al. |
| 6,381,419 B1 | * | 4/2002 | Kinoshita et al. ............. 399/27 |
| 6,589,667 B1 | * | 7/2003 | Hultman et al. ............. 428/548 |

FOREIGN PATENT DOCUMENTS

| | | |
|---|---|---|
| JP | 10-188672 | 7/1998 |
| JP | 10-204223 | 8/1998 |
| JP | 11-134936 | 5/1999 |

* cited by examiner

*Primary Examiner*—Ngoclan T. Mai
(74) *Attorney, Agent, or Firm*—Oblon, Spivak, McClelland, Maier & Neustadt, P.C.

(57) ABSTRACT

Disclosed are provides conductive metal particles and conductive composite metal particles by which conductive materials having stable conductivity can be provided, and applied product thereof.

The conductive metal particles have a number average particle diameter of 5 to 100 $\mu$m, a BET specific surface area of $0.01 \times 10^3$ to $0.7 \times 10^3$ m$^2$/kg, a sulfur element content of at most 0.1% by mass, an oxygen element content of at most 0.5% by mass and a carbon element content of at most 0.1% by mass. The conductive composite metal particles are obtained by coating the surfaces of the conductive metal particles with a high-conductive metal.

9 Claims, 8 Drawing Sheets

CONDUCTIVE METAL PARTICLES, CONDUCTIVE COMPOSITE METAL PARTICLES AND APPLIED PRODUCTS USING THE SAME

This application is a division of application Ser. No. 09/961,323 filed on Sep. 25, 2001, now U.S. Pat. No. 6,663,799.

BACKGROUND OF THE INVENTION

1. Field of the Invention

The present invention relates to conductive metal particles, conductive composite metal particles and applied products using these metal particles.

2. Description of the Background Art

In an electric and electronic field, conductive materials containing conductive particles in an insulating organic material have heretofore been widely used for the purpose of achieving electrical connection between circuit devices and electrical connection between wirings in a circuit device.

In mounting of electronic parts on semiconductor integrated circuit boards or the like, for example, surface mounting and COB (chip on board) are utilized for the purpose of mounting electronic parts on a printed circuit board at a high density. In such a mounting method, a conductive adhesive in the form of paste or a film, which contains conductive particles, is used (see Japanese Patent Application Laid-Open Nos. 84716/1985, 231889/1988, 259766/1992 and 75250/1993, etc.).

An anisotropically conductive sheet containing conductive particles in an elastomer is used as a connector for achieving electrical connection between circuit devices, for example, a printed circuit board and a leadless chip carrier, liquid crystal panel or the like. Further, in electrical inspection of a circuit device such as a printed circuit board or semiconductor integrated circuit, it is conducted to intervene an anisotropically conductive sheet between an electrode region to be inspected of the circuit device, which is an inspection target, and an electrode region for inspection of a circuit board for inspection in order to achieve electrical connection between electrodes to be inspected formed on a surface of the circuit device to be inspected and electrodes for inspection formed on the surface of the circuit board for inspection.

As such an anisotropically conductive sheet, there have heretofore been known those of various structures. For example, those obtained by uniformly dispersing metal particles in an elastomer (see Japanese Patent Application Laid-Open No. 93393/1976), those obtained by unevenly distributing particles of a conductive magnetic material in an elastomer to form many conductive path-forming parts extending in the thickness-wise direction thereof and insulating part for mutually insulating them (see Japanese Patent Application Laid-Open No. 147772/1978, etc.), and those with a difference in level defined between the surface of a conductive path-forming part and an insulating part (see Japanese Patent Application Laid-Open No. 250906/1986, etc.) are known.

Further, in double-side printed circuit boards in which wiring layers are formed on both sides of an insulating layer and multi-layer printed circuit boards in which a plurality of insulating layers and a plurality of wiring layers are alternately laminated, columnar conductive materials with conductive particles contained in a curable resin have been used in recent years, in place of plated through-holes (via-holes) as a means for conducting electrical connection between the wiring layers (see Japanese Patent Application Laid-Open Nos. 255982/1996 and 256687/1998, etc.). Since such a conductive material may be formed by filling a conductive paste composition, in which conductive particles are dispersed in a liquid thermosetting resin, into through-holes bored in an insulating layer, and subjecting the conductive paste composition to a curing treatment, electrical connection between wiring layers can be achieved through simple steps, and moreover circuit boards high in connection reliability can be provided because none of chemicals such as a plating solution are used.

In such conductive materials as described above, composite metal particles obtained by plating the surfaces of particles of a metal, for example, nickel, copper or the like with gold high in conductivity and chemically stable are preferably used as the conductive articles.

Such conductive particles are required to provide conductive materials having stable conductivity, specifically to provide conductive materials which have high conductivity and are high in reproductivity thereof. Therefore, conductive particles whose average particle diameter and particle diameter distribution fall within respective particular ranges are used in the production of conductive materials.

However, it has been found that the mere use of conductive particles whose average particle diameter and particle diameter distribution fall within respective particular ranges fails to provide any conductive material having stable conductivity.

SUMMARY OF THE INVENTION

The present invention has been made on the basis of the foregoing circumstances and the first object of the present invention is to provide conductive metal particles and conductive composite metal particles by which conductive materials having stable conductivity can be provided.

The second object of the present invention is to provide a conductive paste composition which has high conductivity and is high in reproductivity thereof.

The third object of the present invention is to provide a conductive sheet which has high conductivity and is high in reproductivity thereof.

The fourth object of the present invention is to provide a circuit board which has high conductivity between wiring layers thereof and is high in reproductivity thereof and moreover high in connection reliability.

The fifth object of the present invention is to provide a conductive connection structure by which electrical connection high in conductivity and high in reproductivity thereof can be achieved.

The sixth object of the present invention is to provide an electrical inspection apparatus for circuit devices, by which electrical connection high in conductivity and high in reproductivity thereof can be achieved to a circuit device which is an inspection target.

According to the present invention, there are provided conductive metal particles having a number average particle diameter of 5 to 100 $\mu$m, a BET specific surface area of $0.01\times10^3$ to $0.7\times10^3$ $m^2/kg$, a sulfur element content of at most 0.1% by mass, an oxygen element content of at most 0.5% by mass and a carbon element content of at most 0.1% by mass.

In the conductive metal particles according to the present invention, the coefficient of variation of the particle diameter may be preferably at most 50%.

The saturation magnetization thereof may be preferably at least 0.1 Wb/m².

According to the present invention, there are also provided conductive composite metal particles obtained by coating the surfaces of the conductive metal particles described above with a high-conductive metal.

In the conductive composite metal particles according to the present invention, the thickness t of the coating layer of the high-conductive metal, which is calculated out in accordance with the following numerical expression, may be preferably at least 10 nm:

$$t=[1/(Sw\cdot\rho)]\times[N/(1-N)]$$

wherein t is the thickness (m) of the coating layer of the high-conductive metal, Sw is the BET specific surface area (m²/kg) of the conductive metal particles, ρ is a specific gravity (kg/m³) of the high-conductive metal, and N is a ratio of a weight of the coating layer of the high-conductive metal to a weight of the conductive composite metal particles.

In the conductive composite metal particles according to the present invention, the high-conductive metal may be preferably gold.

The content of the high-conductive metal in each surface layer portion of the conductive composite metal particles may be preferably at least 50% by mass.

The BET specific surface area of the conductive composite metal particles may be preferably 0.01×10³ to 0.7×10³ m²/kg.

In the conductive composite metal particles obtained by coating the surfaces of the conductive metal particles whose saturation magnetization is at least 0.1 Wb/m² with the high-conductive metal, the electric resistance value R as measured in the following manner may be preferably at most 1 Ω:

Electric Resistance Value R:

A paste composition is prepared by kneading 0.6 g of the conductive composite metal particles with 0.8 g of liquid rubber, the paste composition is arranged between a pair of electrodes each having a diameter of 1 mm and arranged so as to be opposed to each other at a clearance of 0.5 mm, a magnetic field of 0.3 T is applied to this pair of electrodes, and the pair of electrodes are left to stand in this state until the electric resistance value between the pair of electrodes is stabilized, thereby measuring an electric resistance value at this time.

According to the present invention, there is further provided a conductive paste composition comprising the conductive metal particles and/or conductive composite metal particles described above.

According to the present invention, there is still further provided a conductive sheet comprising the conductive metal particles and/or conductive composite metal particles described above in an organic polymeric substance.

According to the present invention, there is yet still further provided a circuit board comprising a conductor containing the conductive metal particles and/or conductive composite metal particles described above in an organic polymeric substance.

According to the present invention, there is yet still further provided a conductive connection structure connected by the conductive paste composition described above.

According to the present invention, there is yet still further provided a conductive connection structure connected through the conductive sheet described above.

According to the present invention, there is yet still further provided an electrical inspection apparatus for circuit devices, comprising the conductive sheet described above, wherein electrical connection to electrodes to be inspected of a circuit device to be inspected is achieved through the conductive sheet.

BRIEF DESCRIPTION OF THE DRAWINGS

The above and other objects, features and advantages of the present invention will become apparent from the following description and the appended claims, taken in conjunction with the accompanying drawings, in which:

DETAILED DESCRIPTION OF THE PREFERRED EMBODIMENTS

Figure 1:
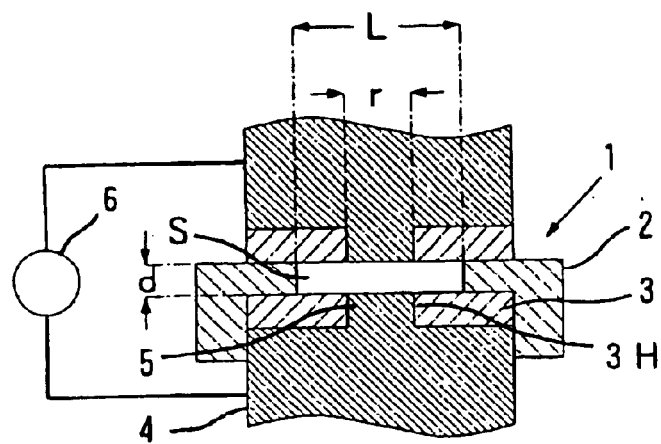
FIG. 1 is a cross-sectional view illustrating the construction of an apparatus for measuring an electric resistance value R.

The embodiments of the present invention will hereinafter be described in details.

[Conductive Metal Particles]

The conductive metal particles according to the present invention are those having a number average particle diameter of 5 to 100 μm, preferably 10 to 50 μm, particularly preferably 10 to 40 μm. In the present invention, the number average particle diameter of the conductive metal particles means a value measured by a laser diffraction scattering method.

When the number average particle diameter is at least 5 μm, the resulting anisotropically conductive sheet is easy to be deformed at its conductive parts when the anisotropically conductive sheet is formed with such conductive metal particles. When a conductive connection structure is formed with such conductive metal particles, the electrical connection of the resulting conductive connection structure becomes easy. When the number average particle diameter is at most 100 μm on the other hand, fine conductive parts in an anisotropically conductive sheet are easy to be formed when the anisotropically conductive sheet is formed with such conductive metal particles. When a conductive connection structure is formed with such conductive metal particles, the electrical connection of the resulting conductive connection structure becomes stable, and the reproductivity thereof becomes good.

The conductive metal particles according to the present invention are those having a BET specific surface area of $0.01 \times 10^3$ to $0.7 \times 10^3$ m$^2$/kg, preferably $0.02 \times 10^3$ to $0.5 \times 10^3$ m$^2$/kg, particularly preferably $0.05 \times 10^3$ to $0.4 \times 10^3$ m$^2$/kg.

When the BET specific surface area is at least $0.01 \times 10^3$ m$^2$/kg, the plating-capable area of such conductive metal particles is sufficiently great. Therefore, the necessary amount of plating can be surely conducted on such conductive metal particles, and thus particles having high conductivity can be obtained. In addition, stable and high conductivity can be achieved because a contact area among the particles is sufficiently great. When the BET specific surface area is at most $0.7 \times 10^3$ m$^2$/kg on the other hand, such conductive metal particles do not become fragile, and thus they are not destroyed when physical stress is applied thereto, and the stable and high conductivity thereof is retained.

The conductive metal particles according to the present invention are those having a sulfur element content of at most 0.1% by mass, preferably at most 0.05% by mass, particularly preferably at most 0.01% by mass.

The conductive metal particles according to the present invention are those having an oxygen element content of at most 0.5% by mass, preferably at most 0.1% by mass, particularly preferably at most 0.05% by mass.

The conductive metal particles according to the present invention are those having a carbon element content of at most 0.1% by mass, preferably at most 0.08% by mass, particularly preferably at most 0.05% by mass.

In the present invention, the sulfur element content, oxygen element content and carbon element content in the conductive metal particles mean respective values obtained by dissolving a particle sample in an aqueous solution of nitric acid and subjecting this solution to inductively coupled plasma atomic emission spectroscopy (ICP-AES).

When such conditions as described above are satisfied, the content of impurities in such conductive metal particles is extremely little. Accordingly, the amount of impurity elements present on the surfaces thereof is also little, and thus a stable amount of plating can be surely conducted. In addition, the coating layer by the plating is scarcely separated. As a result, high conductivity can be surely achieved.

Since a sulfur element may become a catalyst poison in a curing treatment upon the production of a conductive material therefrom, or its use, the curing treatment can be surely conducted upon the production or use of the conductive material when the sulfer element content is at most 0.1% by mass.

In the conductive metal particles according to the present invention, the coefficient of variation of the particle diameter is preferably at most 50%, more preferably at most 40%, still more preferably at most 30%, particularly preferably at most 20%.

In the present invention, the coefficient of variation of the particle diameter is a value determined in accordance with the expression: $(\sigma/Dn) \times 100$, wherein $\sigma$ is a standard deviation value of the particle diameter, and $Dn$ is a number average particle diameter of the particles.

When the coefficient of variation of the particle diameter is at most 50%, the degree of unevenness of the particle diameter is low. Therefore, when an anisotropically conductive sheet is formed with such conductive metal particles, an anisotropically conductive sheet narrow in scattering of conductivity in conductive parts can be provided. When a conductive connection structure is formed with such conductive metal particles, a conductive connection structure narrow in scattering of electrically connected state and good in the reproductivity thereof can be provided.

As a metallic material for forming the conductive particles according to the present, may be used iron, nickel, cobalt, or copper or a resin particles coated with such a metal, or the like. Those having a saturation magnetization of at least 0.1 Wb/m$^2$ may be preferably used. The saturation magnetization thereof is more preferably at least 0.3 Wb/m$^2$, particularly preferably 0.5 Wb/m$^2$. As specific examples of the material, may be mentioned iron, nickel, cobalt and alloys thereof.

When the saturation magnetization is at least 0.1 Wb/m$^2$, such conductive metal particles can be surely moved by the action of a magnetic field to form a chain of the conductive metal particles upon the production or use of various conductive materials containing the conductive metal particles.

No particular limitation is imposed on the specific form of the conductive metal particles according to the present invention. As particles of a preferred form, may be mentioned those having a shape composed of secondary particles obtained by integrally bonding a plurality of spherical primary particles to one another.

Such conductive metal particles can be obtained by forming particles from a metallic material in accordance with a method known per se in the art or providing commercially available metal particles, subjecting the particles to a classification treatment and selecting particles satisfying the above-described conditions as to the BET specific surface area, sulfur element content, oxygen element content and carbon element content.

The classification treatment of the particles can be conducted by means of, for example, a classifier such as an air classifier or sonic classifier.

Specific conditions for the classification treatment are suitably preset according to the intended number average particle diameter of the conductive metal particles, the kind of the classifier, and the like.

According to the conductive metal particles described above, a sufficient amount of plating may be conducted on the surfaces of the particles because the BET specific surface area thereof is $0.01 \times 10^3$ to $0.7 \times 10^3$ m$^2$/kg. Since the content of impurities such as sulfur, oxygen and carbon is low, the adhesion property to a metal by plating is high. Accordingly, various conductive materials having high conductivity can be provided by plating the surfaces thereof with a high-conductive-metal.

[Conductive Composite Metal Particles]

The conductive composite metal particles according to the present invention are obtained by coating the surfaces of the conductive metal particles described above with a high-conductive metal.

The term "high-conductive metal" as used herein means a metal having an electric conductivity of at least $5 \times 10^6$ $\Omega^{-1}m^{-1}$ at 0° C.

As such a high-conductive metal, may be-used gold, silver, rhodium, platinum, chromium or the like. Among these, gold is preferably used in that it is chemically stable and has a high electric conductivity.

In the conductive composite metal particles according to the present invention, the thickness t of the coating layer of the high-conductive metal, which is calculated out in accordance with the following numerical expression, may be preferably at least 10 nm, more preferably 10 to 100 nm:

$$t=[1/(Sw \cdot \rho)] \times [N/(1-N)]$$

wherein t is the thickness (m) of the coating layer of the high-conductive metal, Sw is the BET specific surface area (m$^2$/kg) of the conductive metal particles, $\rho$ is a specific gravity (kg/m$^3$) of the high-conductive metal, and N is a coating rate (a ratio of a weight of the coating layer of the high-conductive metal to a weight of the conductive composite metal particles) of the coating layer of the high-conductive metal.

The above numerical expression is derived in the following manner.

(a) Putting the weight of the conductive metal particles as Mp (kg), the surface area S (m$^2$) of the conductive metal particles is determined by the equation:

$$S=Sw \cdot Mp \qquad (1)$$

(b) Putting the weight of the high-conductive metal as m (kg), the volume V (m$^3$) of the coating layer is determined by the equation:

$$V=m/\rho \qquad (2)$$

(c) Supposing that the thickness of the coating layer is even over the whole surface of the conductive composite particles, t=V/S. When the equations (1) and (2) are substituted into this equation, the thickness t of the coating layer is determined by the equation:

$$t=(m/\rho)/(Sw \cdot Mp)=m/(Sw \cdot \rho \cdot Mp) \qquad (3)$$

(d) Since the coating rate N of the coating layer of the high-conductive metal is a ratio of the weight of the coating layer to the weight of the conductive composite metal particles, the coating rate N is determined by the equation:

$$N=m/(Mp+m) \qquad (4)$$

(e) When the numerator and denominator in the right side of this equation are divided by Mp, N=(m/Mp)/(1+m/Mp) is given. When both sides are multiplied by (1+m/Mp), N(1+m/Mp)=m/Mp or N+N(m/Mp)=m/Mp is given. When N(m/Mp) is shifted to the right side, N=m/Mp−N(m/Mp)=(m/Mp)(1−N) is given. When both sides are divided by (1−N), N/(1−N)=m/Mp is given.

Accordingly, the weight Mp of the conductive metal particles is determined by the equation:

$$Mp=m/(N/[(1-N)]=m(1-N)/N \qquad (5)$$

(f) When the equation (5) is substituted into the equation (3), $t=1/[Sw \cdot \rho \cdot (1-N)/N]=[1/(Sw \cdot \rho)] \times [N/(1-N)]$ is derived.

When the thickness t of the coating layer is at least 10 nm, the conductivity of such conductive composite metal particles becomes high. When a conductive sheet or conductive connection structure is formed with such conductive composite metal particles, the separation of the coating layer due to temperature changes or pressurization to lower conductivity is lessened. Therefore, such conductive composite metal particles are preferred.

The coating rate of the high-conductive metal in the conductive composite metal particles according to the present invention is preferably 0.5 to 50% by mass, more preferably 1 to 40% by mass, still more preferably 3 to 30% by mass, particularly preferably 4 to 30% by mass. When the high-conductive metal to coat is gold, the coating rate is preferably 2.5 to 30% by mass, more preferably 3 to 30% by mass, still more preferably 3.5 to 30% by mass.

The content of the high-conductive metal in each surface layer portion of the conductive composite metal particles according to the present invention is preferably at least 50% by mass.

The term "surface layer portion" as used herein means a portion from the outer surface to the depth of 10 nm in each of the conductive composite metal particles. The content of the high-conductive metal in this surface layer portion can be measured by X-ray photoelectron spectroscopy [electron spectroscopy for chemical analysis (ESCA)].

When this content is at least 50% by mass, the conductivity of such conductive composite metal particles become high. When a conductive sheet or conductive connection structure is formed with such conductive composite metal particles, the separation of the coating layer due to temperature changes or pressurization to lower conductivity is lessened. Therefore, such conductive composite metal particles are preferred.

The BET specific surface area of the conductive composite metal particles according to the present invention is preferably $0.01 \times 10^3$ to $0.7 \times 10^3$ m$^2$/kg.

When the BET specific surface area is at least $0.01 \times 10^3$ m$^2$/kg, the surface area of the coating layer is sufficiently great, so that the coating layer in which total weight of the high-conductive metal is great can be formed. Accordingly, particles high in conductivity can be obtained. In addition, stable and high conductivity can be achieved because a contact area among the particles is sufficiently great. When the BET specific surface area is at most $0.7 \times 10^3$ m²/kg on the other hand, such conductive metal particles do not become fragile, and thus they are not destroyed when physical stress is applied thereto, and the stable and high conductivity thereof is retained.

When conductive metal particles whose saturation magnetization is at least 0.1 Wb/m² are used in the conductive composite metal particles according to the present invention, the electric resistance value R of the conductive composite metal particles as measured in the following manner is preferably at most 1 Ω, more preferably at most 0.5 Ω, particularly preferably at most 0.1 Ω.

Electric Resistance Value R:

A paste composition is prepared by kneading 6 g of the conductive composite metal particles with 8 g of liquid rubber, the paste composition is arranged between a pair of electrodes each having a diameter of 1 mm and arranged so as to be opposed to each other at a clearance of 0.5 mm, a magnetic field of 0.3 T is applied to this pair of electrodes, and the pair of electrodes are left to stand in this state until the electric resistance value between the pair of electrodes is stabilized, thereby measuring an electric resistance value at this time.

Specifically, the electric resistance value R is measured in the following manner.

FIG. 1 illustrates an apparatus for measuring an electric resistance value R. Reference numeral 1 indicates a ceramic cell in which a sample chamber S is formed, and the cell is constructed by a cylindrical side wall member 2 and a pair of lid members 3 each having a through-hole 3H at its center. Reference numeral 4 designates a pair of conductive magnets each having an electrode part 5 which is in the form projecting from the surface thereof and fitted to the through-hole 3H in the lid member 3. Each magnet is fixed to the lid member 3 in a state that the electrode part 5 is fitted into the through-hole 3H in the lid member 3. Reference numeral 6 indicates an electric resistance meter which is connected to each of the pair of magnet 4. The sample chamber S of the cell 1 is in the form of a disk having a diameter L of 3 mm and a thickness d of 0.5 mm, and the inner diameter of the through-hole 3H in the lid member 3, i.e., the diameter r of the electrode part 5 of the magnet 4 is 1 mm.

The paste composition described above is filled into the sample chamber S of the cell 1, and an electric resistance value between the electrodes 5 of the magnets 4 is measured by the electric resistance meter 6 while applying a parallel magnetic field of 0.3 T between the electrodes 5 of the magnets 4 in the thickness-wise direction of the sample chamber S. As a result, the conductive composite metal particles dispersed in the paste composition are gathered between the electrodes 5 of the magnets 4 by the operation of the parallel magnetic field and oriented so as to be arranged in the thickness-wise direction. With the movement of the conductive composite metal particles, the electric resistance value between the electrodes 5 of the magnets 4 lowers and then becomes a stabilized state, thereby measuring an electric resistance value at this time. The time from the time the parallel magnetic field has been applied to the paste composition up to the time the electric resistance value between the electrodes 5 of the magnets 4 has reached the stabilized state varies according to the kind of the conductive composite metal particles. However, an electric resistance value after 500 seconds have elapsed from the application of the parallel magnetic field to the paste composition is generally measured as the electric resistance value R.

When the electric resistance value R is at most 1 Ω, a conductive material having high conductivity can be surely obtained.

The water content in the conductive composite metal particles is preferably at most 5% by mass, more preferably at most 3% by mass, still more preferably at most 2% by mass, particularly preferably at most 1% by mass. The use of the conductive composite metal particles satisfying such conditions can prevent or inhibit the occurrence of bubbles in a curing treatment upon the production of a conductive material therefrom or use thereof.

The conductive composite metal particles according to the present invention may be those the surfaces of which have been treated with a coupling agent such as a silane coupling agent. By treating the surfaces of the conductive composite metal particles with the coupling agent, the adhesion property of the conductive composite metal particles to organic polymeric substances is enhanced, so that conductive materials high in durability can be provided.

The amount of the coupling agent used is suitably selected within limits not affecting the conductivity of the conductive composite metal particles. However, it is preferably such an amount that a coating rate (proportion of coated area of the coupling agent to the surface area of the conductive core particles) of the coupling agent on the surfaces of the conductive composite metal particles amounts to at least 5% by mass, more preferably 7 to 100% by mass, still more preferably 10 to 100% by mass, particularly preferably 20 to 100% by mass.

The conductive composite metal particles according to the present invention are obtained in the following manner.

Surfaces of the conductive metal particles are first treated with an acid and then washed with, for example, purified water, whereby impurities such as dirt, foreign matter and oxidized films present on the surfaces of the conductive metal particles are removed. Thereafter, the surfaces of the conductive metal particles are coated with a high-conductive metal.

As examples of the acid used for treating the surfaces of the particles, may be mentioned hydrochloric acid.

As a method for coating the surfaces of the conductive metal particles with the high-conductive metal, may be used electroless plating, displacement plating or the like. However, the method is not limited to these methods.

A process for producing the conductive composite metal particles by the electroless plating or displacement plating will be described. The conductive metal particles subjected to the acid treatment and washing treatment are first added to a plating solution to prepare a slurry, and electroless plating or displacement plating on the conductive metal particles is conducted while stirring the slurry. The particles in the slurry are then removed from the plating solution. Thereafter, the particles removed are subjected to a washing treatment with, for example, purified water, thereby obtaining conductive composite metal particles with the surfaces of the conductive metal particles coated with the high-conductive metal.

Alternatively, primer plating may be conducted on the surfaces of the conductive metal particles to form a primer plating layer, and a plating layer composed of the high-conductive metal may be then formed on the surface of the primer plating layer. No particular limitation is imposed on the process for forming the primer plating layer and the plating layer formed thereon. However, it is preferable to form the primer plating layer on the surfaces of the conductive metal particles by the electroless plating and then form the plating layer composed of the high-conductive metal on the surface of the primer plating layer by the displacement plating.

No particular limitation is imposed on the-plating solution used in the electroless plating or displacement plating, and various kinds of commercially available plating solutions may be used.

Since conductive composite metal particles having a great particle diameter may be produced due to aggregation of the conductive metal particles upon the coating of the surfaces of the particles with the high-conductive metal, the resulting conductive composite metal particles are preferably classified as needed. By the classification treatment, the conductive composite metal particles having the expected particle diameter can be surely obtained.

As examples of a classifier used for conducting the classification treatment, may be mentioned those exemplified as the classifier used in the classification treatment of the conductive metal particles.

According to such conductive composite metal particles as described above, various kinds of conductive materials having high conductivity can be provided because they are obtained by coating the surfaces of the conductive metal particles with the high-conductive metal.

[Conductive Paste Composition]

The conductive paste composition according to the present invention comprises the above-described conductive metal particles and/or the above-described conductive composite metal particles (hereinafter, these particles may also be referred to generically as "the specific conductive particles"), preferably, the conductive composite metal particles in an insulating liquid vehicle.

No particular limitation is imposed on the insulating liquid vehicle so far as it may become a solid by a curing treatment, drying treatment or the like, and various vehicles may be used. As such a vehicle, may be used a liquid curable resin, liquid rubber, or a thermoplastic resin or thermoplastic elastomer dissolved in a proper solvent.

As specific examples of the curable resin, may be mentioned epoxy resins, urethane resins, phenol resins, acrylic resins, silicone resins and bismaleimidotriazine resins.

As specific examples of the liquid rubber, may be mentioned liquid silicone rubber and liquid urethane rubber.

As specific examples of the thermoplastic resin, may be mentioned acrylic resins, ethylene-vinyl acetate copolymer resins, styrene resins and styrene-butadiene block copolymer resins.

A proportion of the specific conductive particles in the conductive paste composition varies according to the kind of the vehicle used, the use application of the conductive paste composition, etc. However, it is generally 20 to 100 parts by mass, preferably 30 to 80 parts by mass per 100 parts by mass of the vehicle.

According to such a conductive paste composition described above, high conductivity is achieved, and high reproductivity as to the conductivity is achieved because the specific conductive particles are contained.

The conductive paste composition may be preferably used as a conductive adhesive for achieving electrical connection between various circuit devices, a material for forming conductive sheets or films, a material for forming conductors in circuit boards, an anisotropically conductive adhesive used in the production of liquid crystal panels and the like, or the like.

[Conductive Sheet]

The conductive sheet according to the present invention comprises the above-described conductive metal particles and/or the above-described conductive composite metal particles, preferably, the conductive composite metal particles in an organic polymeric substance.

No particular limitation is imposed on the organic polymeric substance used in forming the conductive sheet, and various substances, for example, thermoplastic resins, heat- or radiation-curable resins, thermoplastic elastomers, curable rubbers may be used.

Specific examples of the thermoplastic resin used in forming the conductive sheet include olefin resins such as polyethylene resins, polypropylene resins and polybutene resins; styrene resins such as polystyrene resins, styrene-acrylonitrile copolymer resins, styrene-butadiene copolymer resins and styrene-butadiene-acrylonitrile terpolymer resins; acrylic resins such as polymethyl acrylate resins and polymethyl methacrylate resins; polyester resins such as polyethylene terephthalate resins and polybutylene terephthalate resins; polycarbonate resins; polyurethane resins; polyamide resins; and fluorocarbon resins.

Specific examples of the heat- or radiation-curable resin used in forming the conductive sheet include epoxy resins, phenol resins, polyimide resins, polyurethane resins, melamine resins and urea resins. Among these, epoxy resins are preferred. Examples thereof include bisphenol A type epoxy resins, bisphenol F type epoxy resins, (cresol) novolak type epoxy resins, halogenated bisphenol type epoxy resins, resorcin type epoxy resins, tetrahydroxyphenylethane type epoxy resins, polyalcohol polyglycol type epoxy resins, glycerol triether type epoxy resins, polyolefin type epoxy resins, and epoxy resins obtained by epoxidated soybean oil, cyclopentadiene dioxide, vinylcyclohexene dioxide or the like. Among these, bisphenol A type epoxy resins, bisphenol F type epoxy resins and (cresol) novolak type epoxy resins are further preferred.

As raw materials used for obtaining the epoxy resins, may be used low-molecular epoxy compounds such as $C_{12}$–$C_{13}$ mixed alcohol glycidyl ether, 2-ethylhexylglycol glycidyl ether, ethylene glycol diglycidyl ether, diethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, glycerol diglycidyl ether, trimethylolpropane triglycidyl ether, hydrogenated bisphenol A diglycidyl ether and 2,2-dibromoneopentylglycol diglycidyl ether. Among these, neopentyl glycol diglycidyl ether, 1,6-hexanediol diglycidyl ether, glycerol diglycidyl ether and trimethylolpropane triglycidyl ether are preferred.

Specific examples of the thermoplastic elastomer used in forming the conductive sheet include polystyrene type thermoplastic elastomers, polyolefin type thermoplastic elastomers, polyvinyl chloride type thermoplastic elastomers, polyester type thermoplastic elastomers, polyurethane type thermoplastic elastomers, polyamide type thermoplastic elastomers and fluorine-containing polymer type thermoplastic elastomers.

Specific examples of the curable rubber used in forming the conductive sheet include conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block terpolymer rubber and styrene-isoprene block copolymer rubber, and hydrogenated products thereof; and chloroprene, urethane rubber, polyester rubber, epichlorohydrin rubber, silicone rubber, ethylene-propylene copolymer rubber and ethylene-propylene-diene terpolymer rubber.

The conductive sheet according to the present invention may be either an isotropically conductive sheet exhibiting conductivity in both thickness-wise direction and plane direction thereof or an anisotropically conductive sheet exhibiting conductivity only in the thickness-wise direction.

When an anisotropically conductive sheet is formed, it may be either a sheet exhibiting conductivity in the thickness-wise direction in a state not pressurized or a sheet exhibiting conductivity in the thickness-wise direction in a state pressurized. Further, the sheet may be either of the so-called dispersed type that exhibits conductivity in the thickness-wise direction over the whole surface thereof, or of the so-called uneven distribution type in which a plurality of conductive parts each extending in the thickness-wise direction are arranged in a state mutually insulated by insulating part or parts. When an anisotropically conductive sheet of the uneven distribution type is formed, the surface thereof may be flat or formed in a state that the surfaces of the conductive parts are projected from the surfaces of the insulating part. An example where an anisotropically conductive sheet is formed will hereinafter be described.

Figure 2:
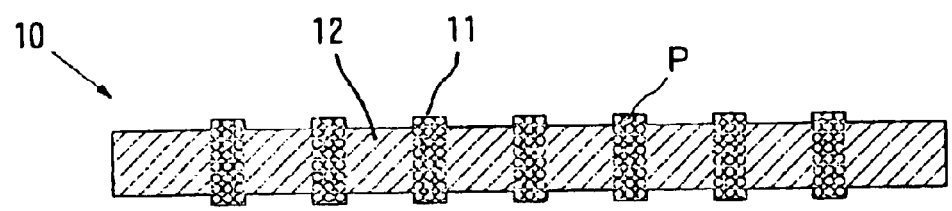
FIG. 2 is a cross-sectional view illustrating the construction of an exemplary anisotropically conductive sheet according to the present invention.

FIG. 2 is a cross-sectional view illustrating the construction of an exemplary anisotropically conductive sheet according to the present invention. In the anisotropically conductive sheet 10, the specific conductive particles P are contained in a base material composed of an elastic polymeric substance in a state oriented so as to be arranged in the thickness-wise direction of the anisotropically conductive sheet 10. Conductive paths are formed by respective chains of the specific conductive particles P. In an embodiment illustrated, the anisotropically conductive sheet is composed of a plurality of columnar conductive parts 11 each closely filled with the specific conductive particles P and extending in the thickness-wise direction of the sheet, and insulating part 12 in which the specific conductive particles P are not present at all or scarcely present, and which insulate these conductive parts 11 mutually. The conductive parts 11 are arranged along the plane direction of the sheet according to a pattern corresponding to a pattern of electrodes to be connected, for example, electrodes to be inspected of a circuit device, which is an inspection target, for example, and the insulating part 12 is formed so as to surround each of these conductive parts 11.

In this embodiment, each of the conductive parts 11 is formed in a state projected from the surface of the insulating part 12.

In the above-described anisotropically conductive sheet, the thickness of the insulating part 12 is preferably 0.05 to 2 mm, particularly 0.1 to 1 mm.

The projected height of each of the conductive parts 11 from the surface of the insulating part 12 is preferably 0.5 to 100%, more preferably 1 to 80%, particularly preferably 5 to 50% of the thickness of the insulating part 12. Specifically, the projected height is preferably 0.01 to 0.3 mm, more preferably 0.02 to 0.2 mm, particularly preferably 0.03 to 0.1 mm.

The diameter of each of the conductive parts 11 is preferably 0.05 to 1 mm, particularly 0.1 to 0.5 mm.

The elastic polymeric substance making up the base material of the anisotropically conductive sheet 10 is preferably cured liquid rubber. As such liquid rubber, may be used liquid silicone rubber, liquid polyurethane rubber or the like. Among these, liquid silicone rubber is preferred. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxysilane and then fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and the polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

On the other hand, hydroxyl group-containing liquid silicone rubber (hydroxyl group-containing dimethyl polysiloxane) is generally obtained by subjecting dimethyldichlorosilane or dimethyldialkoxy-silane to hydrolysis and condensation reaction in the presence of dimethylhydrochlorosilane or dimethyl-hydroalkoxysilane and then fractionating the reaction product by, for example, repeated dissolution-precipitation.

It is also obtained by subjecting a cyclic siloxane to anionic polymerization in the presence of a catalyst, using, for example, dimethylhydrochloro-silane, methyldihydrochlorosilane or dimethyl-hydroalkoxysilane as a polymerization terminator and suitably selecting other reaction conditions (for example, amounts of the cyclic siloxane and the polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such an elastic polymeric substance preferably has a molecular weight Mw (weight average molecular weight as determined in terms of standard polystyrene) of 10,000 to 40,000. The elastic polymeric substance also preferably has a molecular weight distribution index (a ratio Mw/Mn of weight average molecular weight Mw as determined in terms of standard polystyrene to number average molecular weight Mn as determined in terms of standard polystyrene) of at most 2 from the viewpoint of the heat resistance of the resulting anisotropically conductive sheet.

In the above, a curing catalyst for curing the polymeric substance-forming material may be contained in the sheet-forming material for obtaining the anisotropically conductive sheet. As such a curing catalyst, may be used an organic peroxide, fatty acid azo compound, hydrosilylation catalyst or the like.

Specific example of the organic peroxide used as the curing catalyst include benzoyl peroxide, bisdicyclobenzoyl peroxide, dicumyl peroxide and di-tert-butyl peroxide.

Specific example of the fatty acid azo compound used as the curing catalyst include azobisisobutyronitrile.

Specific example of that may be used as the catalyst for hydrosilylation reaction include publicly known catalysts such as chloroplatinic acid and salts thereof, platinum-unsaturated group-containing siloxane complexes, vinylsiloxane-platinum complexes, platinum-1,3-divinyltetramethyldisiloxane complexes, complexes of triorganophosphine or triorganophosphite and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by mass per 100 parts by mass of the polymeric substance-forming material.

In the sheet-forming material, may be contained a general inorganic filler such as silica powder, colloidal silica, aerogel silica or alumina as needed. By containing such an inorganic filler, the thixotropic property of the sheet-forming material is ensured, the viscosity thereof becomes high, the dispersion stability of the specific conductive particles is enhanced, and moreover the strength of the resulting anisotropically conductive sheet is enhanced.

No particular limitation is imposed on the amount of such an inorganic filler used. However, the use in a large amount is not preferred because the orientation of the specific conductive particles by a magnetic field cannot be fully achieved.

The viscosity of the sheet-forming material is preferably within a range of from 100,000 to 1,000,000 cP at 25° C.

The specific conductive particles P are preferably contained in the conductive parts 11 in a proportion of 5 to 60%, more preferably 8 to 50%, particularly preferably 10 to 40% in terms of volume fraction. When this proportion is at least 5%, conductive parts 11 sufficiently small in electric resistance value are easily obtained. When the proportion is at most 60% on the other hand, the resulting conductive parts 11 are hard to become fragile, so that elasticity required of the conductive parts is easily achieved.

The electric resistance of the conductive parts 11 in the thickness-wise direction thereof is preferably at most 100 mΩ in a state that the conductive parts 11 are pressurized under a load of 10 to 20 gf in the thickness-wise direction.

Such an anisotropically conductive sheet 10 can be produced, for example, in the following manner.

Figure 3:
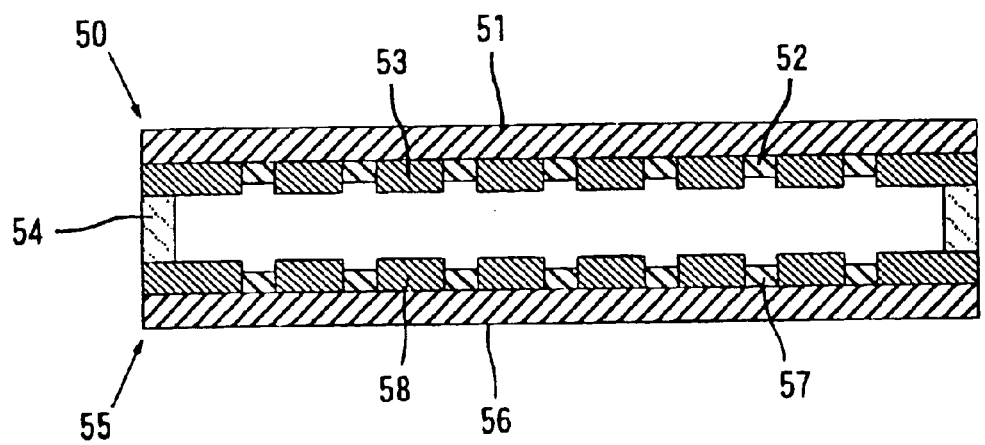
FIG. 3 is a cross-sectional view illustrating a mold used for producing the anisotropically conductive sheet shown in FIG. 2.

FIG. 3 is a cross-sectional view illustrating the construction of an exemplary mold used for producing an anisotropically conductive sheet according to the present invention. This mold is so constructed that a top force 50 and a bottom force 55 making a pair therewith are arranged so as to be opposed to each other through a frame-like spacer 54. A mold cavity is defined between the lower surface of the top force 50 and the upper surface of the bottom force 55.

In the top force 50, ferromagnetic layer portions 52 are formed in accordance with a pattern antipodal to the arrangement pattern of the conductive parts 11 of the intended anisotropically conductive sheet 10 on the lower surface of a base plate 51, and non-magnetic layer portion 53 having a thickness greater than that of the feffomagnetic layer portions 52 is formed at other area than the ferromagnetic layer portions 52.

In the bottom force 55 on the other hand, ferromagnetic layer portions 57 are formed in accordance with the same pattern as the arrangement pattern of the conductive parts 11 of the intended anisotropically conductive sheet 10 on the upper surface of a base plate 56, and non-magnetic layer portion 58 having a thickness greater than that of the feffomagnetic layer portions 57 is formed at other area than the ferromagnetic material portions 57.

As a material for forming the base plates 51, 56 in both top force 50 and bottom force 55, may be used a ferromagnetic metal such as iron, iron-nickel alloy, iron-cobalt alloy, nickel or cobalt, a non-magnetic metal such as aluminum, ceramic, or the like. However, the ferromagnetic metal is preferably used. The base plates 51, 56 preferably each have a thickness of 0.1 to 50 mm, and are preferably smooth at surfaces thereof and subjected to a chemical degreasing treatment or mechanical polishing treatment.

As a material for forming the ferromagnetic layer portions 52, 57 in both top force 50 and bottom force 55, may be used a ferromagnetic metal such as iron, iron-nickel alloy, iron-cobalt alloy, nickel or cobalt. The ferromagnetic layer portions 52, 57 preferably each have a thickness of at least 10 $\mu$m. If the thickness is smaller than 10 $\mu$m, it is difficult to apply a magnetic field having sufficient intensity distribution to a sheet-forming material layer to be formed in the mold. As a result, it is difficult to gather the specific conductive particles at a high density at portions of the sheet-forming material layer, where conductive parts are to be formed, and so a sheet having good anisotropic conductivity may not be provided in some cases.

As a material for forming the non-magnetic layer portions 53, 58 in both top force 50 and bottom force 55, may be used a non-magnetic metal such as copper, a polymeric substance having heat resistance, or the like. However, a polymeric substance cured by radiation may preferably used in that the non-magnetic layer portions 53, 58 can be easily formed by a technique of photolithography. As a material therefor, may be used, for example, a photoresist such as an acrylic type dry film resist, epoxy type liquid resist or polyimide type liquid resist.

The thickness of the non-magnetic layer portions 53, 58 is preset according to the thickness of the ferromagnetic layer portions 52, 57 and the projected height of the conductive parts 11 of the intended anisotropically conductive sheet 10.

The anisotropically conductive sheet 10 is produced by using the above-described mold in the following manner.

Figure 4:
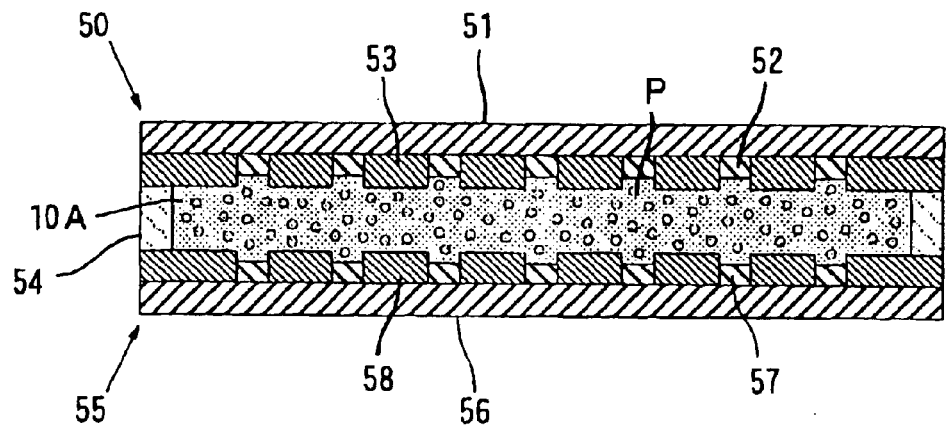
FIG. 4 is a cross-sectional view illustrating a state that a sheet-forming material layer composed of a conductive paste composition has been formed in the mold shown in FIG. 3.

A sheet-forming material composed of a conductive paste composition in which the specific conductive particles P exhibiting magnetism are dispersed in a polymeric substance-forming material is first prepared, and the sheet-forming material is filled into the cavity of the mold as illustrated in FIG. 4, thereby forming a sheet-forming material layer 10A.

Figure 5:
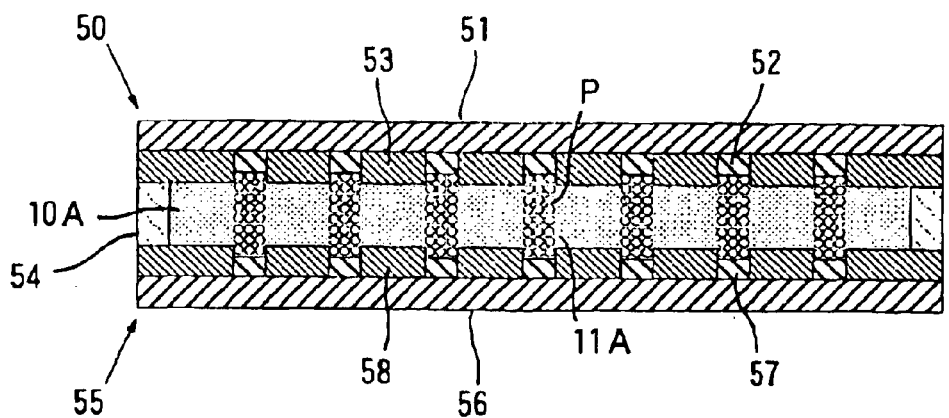
FIG. 5 is a cross-sectional view illustrating a state that a magnetic field has bee applied to the sheet-forming material layer in the thickness-wise direction thereof.

A pair of electromagnets, for example, are then arranged on the upper surface of the base plate 51 in the top force 50 and the lower surface of the base plate 56 in the bottom force 55, and the electromagnets are operated, thereby applying a parallel magnetic field having an intensity distribution, i.e., a parallel magnetic field having higher intensity at portions between ferromagnetic material portions 52 in the top force 50 and their corresponding ferromagnetic material portions 57 in the bottom force 55, to the sheet-forming material layer 10A in the thickness-wise direction thereof. As a result, in the sheet-forming material layer 10A, the specific conductive particles P dispersed in the sheet-forming material layer 10A are gathered at portions 11A to become the conductive parts, which are located between the ferromagnetic material portions 52 in the top force 50 and their corresponding ferromagnetic material portions 57 in the bottom force 55, as illustrated in FIG. 5, and at the same time oriented so as to be arranged in the thickness-wise direction of the sheet-forming material layer 10A.

In this state, the sheet-forming material layer 10A is subjected to a curing treatment, thereby producing an anisotropically conductive sheet 10 comprising conductive parts 11 arranged between the ferromagnetic material portions 52 in the top force 50 and their corresponding ferromagnetic material portions 57 in the bottom force 55, in which the specific conductive particles P are closely filled in the elastic polymeric substance, and insulating part 12 composed of the elastic polymeric substance, in which the specific conductive particles P are not present at all or scarcely present.

In the above-described process, the curing treatment of the sheet-forming material layer 10A may be conducted in the state that the parallel magnetic field is being applied. However, the treatment may also be conducted after stopping the application of the parallel magnetic field.

The intensity of the parallel magnetic field applied to the sheet-forming material layer 10A is preferably an intensity that it amounts to 0.1 to 2 T on the average.

As a means for applying the parallel magnetic field to the sheet-forming material layer 10A, permanent magnets may also be used in place of the electromagnets. As such permanent magnets, are preferred those composed of alunico (Fe—Al—Ni—Co alloy), ferrite or the like in that the intensity of the parallel magnetic field within the above range is achieved.

The curing treatment of the sheet-forming material layer 10A is suitably selected according to the material used. However, the treatment is generally conducted by a heat treatment. Specific heating temperature and heating time are suitably selected in view of the kind of the addition type liquid silicone rubber or the like making up the sheet-forming material layer 10A, the time required for movement of the conductive particles, and the like.

Since such an anisotropically conductive sheet 10 described above has the conductive parts 11 containing the specific conductive particles P, high conductivity is achieved at the conductive parts 11, and moreover high reproductivity as to the conductivity thereof is achieved.

Such an anisotropically conductive sheet 10 is suitable for use as a connector for achieving electrical connection between, for example, a printed circuit board and a leadless chip carrier, liquid crystal panel or the like in fields of electronic computers, electronic digital clocks, electronic cameras and computer key boards, or in electrical inspection of circuit devices such as printed circuit boards, semiconductor integrated circuit devices and wafers on the surface of which a number of integrated circuits have been formed, as a connector for achieving electrical connection between electrodes to be inspected formed on a surface of a circuit device, which is an inspection target, and electrodes for inspection formed on the surface of a circuit board for inspection.

[Circuit Board]

The circuit board according to the present invention comprises a conductor containing the above-described conductive metal particles and/or the above-described conductive composite metal particles.

Figure 6:
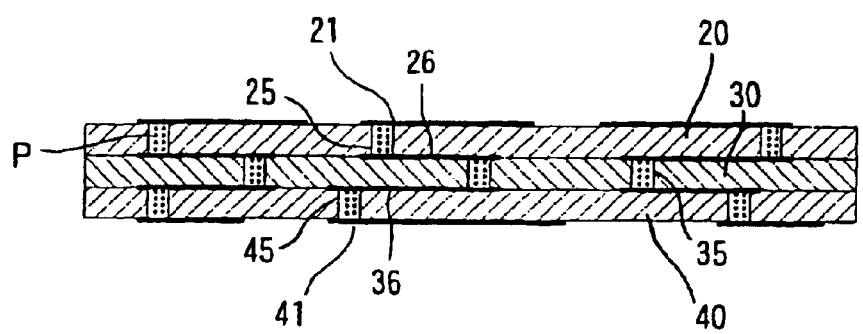
FIG. 6 is a cross-sectional view illustrating the construction of an exemplary circuit board according to the present invention.

FIG. 6 is a cross-sectional view illustrating the construction of principal parts in an exemplary circuit board according to the present invention. This circuit board is a multi-layer printed circuit board and is constructed by laminating a first insulating layer 20, a second insulating layer 30 and a third insulating layer 40 in this order from above. On the upper surface of the first insulating layer 20, an upper-side wiring layer 21 is formed, and a lower-side wiring layer 41 is formed on the lower surface of the third insulating layer 40. A first inner wiring layer 26 is formed between the first insulating layer 20 and the second insulating layer 30, and a second inner wiring layer 36 is formed between the second insulating layer 30 and the third insulating layer 40.

First interlayer short circuit parts 25, second interlayer short circuit parts 35 and third interlayer short circuit parts 45 are provided in the first insulating layer 20, the second insulating layer 30 and the third insulating layer 40, respectively, so as to extend in their thickness-wise directions. The upper-side wiring layer 21 is electrically connected to the first inner wiring layer 26 through the first interlayer short circuit parts 25, the first inner wiring layer 26 is electrically connected to the second inner wiring layer 36 through the second interlayer short circuit parts 35, and the second inner wiring layer 36 is electrically connected to the lower-side wiring layer 41 through the third interlayer short circuit parts 45.

As a material for forming each of the first insulating layer 20, the second insulating layer 30 and the third insulating layer 40, is preferably used an insulating resin material high in heat resistance. Specific examples thereof include glass fiber-reinforced epoxy resins, glass fiber-reinforced polyimide resins, glass fiber-reinforced phenol resins, glass fiber-reinforced bismaleimidotriazine resins and glass fiber-reinforced aramide resins.

The first interlayer short circuit parts 25, the second interlayer short circuit parts 35 and the third interlayer short circuit parts 35 are each formed by a conductor containing the specific conductive particles P in an organic polymeric substance. In this embodiment, the specific conductive particles P are bound to the organic polymeric substance in a state oriented so as to be arranged in the thickness-wise direction of the insulating layer concerned.

As the organic polymeric substance for forming each of the first interlayer short circuit parts 25, the second interlayer short circuit parts 35 and the third interlayer short circuit parts 45, may be used a thermosetting resin such as an epoxy resin, polyimide resin, phenol resin, bismaleimidotriazine resin, or a cured product of liquid rubber such as silicone rubber or urethane rubber.

In each of the first interlayer short circuit parts 25, the second interlayer short circuit parts 35 and the third interlayer short circuit parts 45, the specific conductive particles P are preferably contained in a proportion of 30 to 60%, more preferably 35 to 50 in terms of volume fraction. If this proportion is lower than 30%, any interlayer short circuit part sufficiently low in electric resistance may not be obtained in some cases. If this proportion exceeds 60% on the other hand, the resulting short circuit parts become fragile, so that necessary strength and durability may not be achieved in some cases.

The above-described circuit board can be produced in the following manner.

Figure 7:
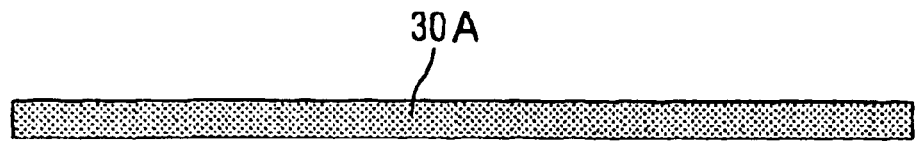
FIG. 7 is a cross-sectional view illustrating a second insulating layer-forming material for forming a second insulating layer in the circuit board shown in FIG. 6.
Figure 8:
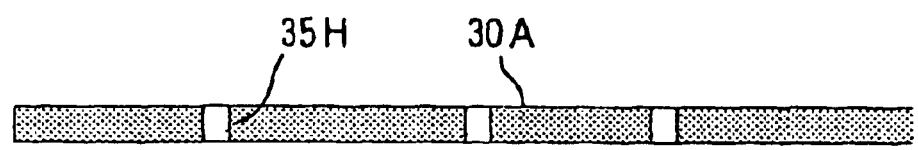
FIG. 8 is a cross-sectional view illustrating a state that through-holes have been formed in the second insulating layer-forming material.

As illustrated in FIG. 7, a second insulating layer-forming material (material for forming the second insulating layer 30) 30A in the form of a sheet composed of a thermosetting resin material in a semi-cured state is provided. As illustrated in FIG. 8, through-holes 35H passing through in the thickness-wise direction of the second insulating layer-forming material 30A are bored at portions of the second insulating layer-forming material 30A, where the second interlayer short circuit parts are to be formed.

Figure 9:
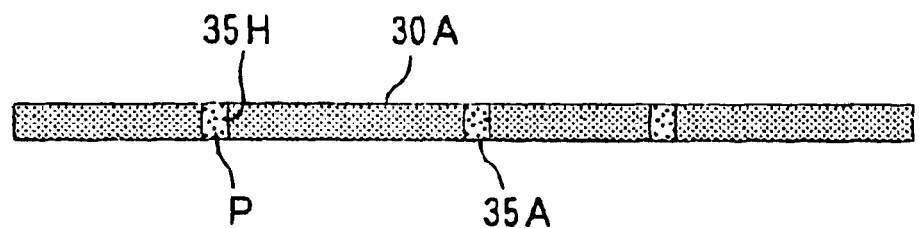
FIG. 9 is a cross-sectional view illustrating a state that a short circuit part-forming material layer has been formed in each of the through-holes in the second insulating layer-forming material.

After a short circuit-forming material composed of a conductive paste composition with the specific conductive particles P exhibiting magnetism contained in a liquid thermosetting resin material is then filled into each of the through-holes 35H bored in the second insulating layer-forming material 30A, the short circuit-forming material is subjected to a heat treatment, thereby forming a short circuit part-forming material layer 35A in each of the through-holes 35H in the second insulating layer-forming material 30A as illustrated in FIG. 9. This short circuit part-forming material layer 35A is in a state that the form of the short circuit part-forming material layer 35A is retained, and it has been semi-cured to an extent that the specific conductive particles P can be moved in the short circuit part-forming material layer 35A.

As a means for making the through-holes 35H in the second insulating layer-forming material 30A in the above process, may be used a means by laser processing, a means by drilling, a means by punching, or the like.

As a means for filling the short circuit-forming material into the through-holes 35H in the second insulating layer-forming material 30A, may be used a printing method such as screen printing, roll pressing, or the like.

The heat treatment of the short circuit-forming material is conducted under conditions that the cure of the second insulating layer-forming material 30A is not caused to progress. Specific conditions of the heat treatment are suitably preset according to the kinds of the second insulating layer-forming material 30A and the short circuit-forming material. However, in general, the heating temperature is 80 to 100° C., and the heating time is 20 to 60 minutes.

Figure 10:
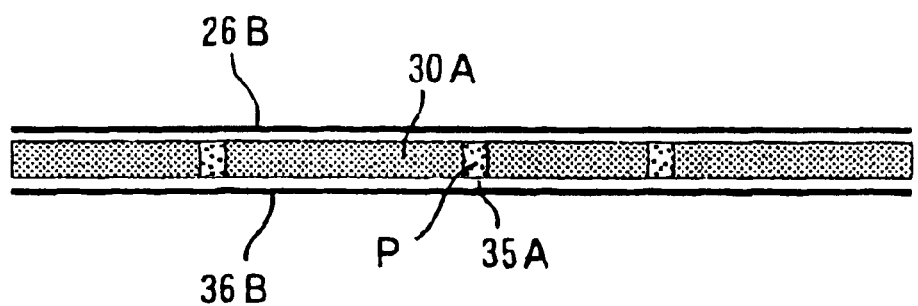
FIG. 10 is a cross-sectional view illustrating a state that a metal foil has been laminated on each side of the second insulating layer-forming material.

After metal foils 26B and 36B composed of, for example, copper are provided on the upper and lower surfaces of the second insulating layer-forming material 30A, respectively, as illustrated in FIG. 10, the second insulating layer-forming material 30A and the short circuit-forming material layer 35A are subjected to a heat treatment while applying a parallel magnetic field to the short circuit-forming material layer 35A in the thickness-wise direction thereof in a state that the metal foil 26B, the second insulating layer-forming material 30A and the metal foil 36B have been pressurized in the thickness-wise direction thereof, thereby compressing the second insulating layer-forming material 30A and the short circuit-forming material layer 35A in the thickness-wise direction.

Figure 11:
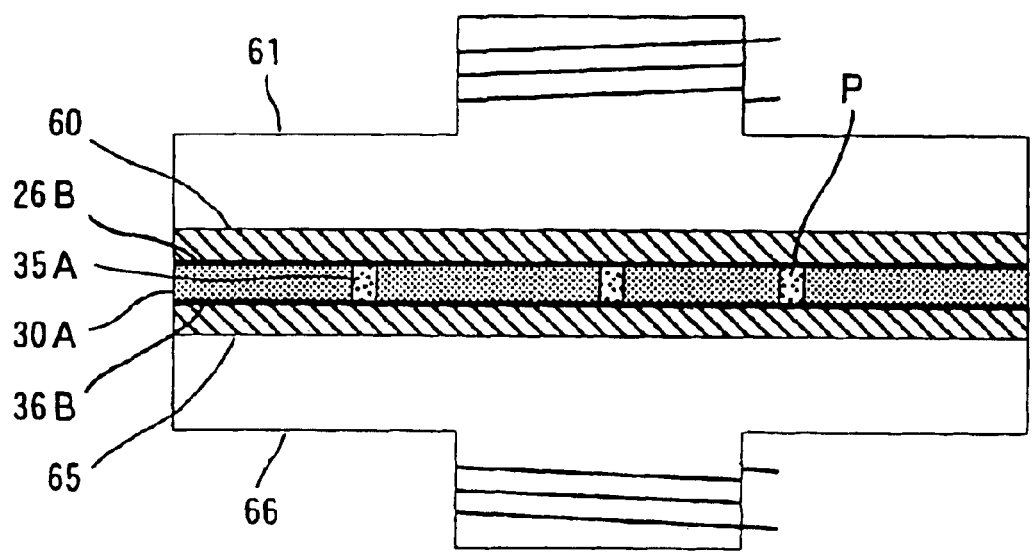
FIG. 11 is a cross-sectional view illustrating a state that the short circuit part-forming material layers and the second insulating layer-forming material have been subjected to a heat treatment while applying a magnetic field to the short circuit part-forming material layers.

More specifically, as illustrated in FIG. 11, magnetic pole plates 60 and 65 composed of a ferromagnetic material are arranged on the upper surface of the metal foil 26B and the lower surface of the metal foil 36B, respectively, and a pair of electromagnets 61 and 66 are further arranged on the upper surface of the magnetic pole plate 60 and the lower surface of the magnetic pole plate 65, respectively. The electromagnets 61, 66 are operated in a state that the metal foil 26B, the second insulating layer-forming material 30A and the metal foil 36B are pressurized in the thickness-wise direction thereof, thereby applying a parallel magnetic field to the short circuit-forming material layer 35A in the thickness-wise direction thereof and at the same time subjecting the second insulating layer-forming material 30A and the short circuit-forming material layer 35A to a heat treatment.

As the ferromagnetic material making up the magnetic pole plates 60, 65, may be used iron, nickel, cobalt or an alloy thereof.

The pressurizing conditions for the metal foil 26B, the second insulating layer-forming material 30A and the metal foil 36B are generally 5 to 50 kg/cm².

The intensity of the parallel magnetic field applied to the short circuit-forming material layer 35A is preferably 0.1 to 2 T on the average. As a means for applying the parallel magnetic field, permanent magnets may also be used in place of the electromagnets. As such permanent magnets, are preferred those composed of alunico (Fe—Al—Ni—Co alloy), ferrite or the like in that the intensity of the parallel magnetic field within the above range is achieved.

The conditions for the heat treatment are suitably selected according to the kinds of the second insulating layer-forming material 30A and the short circuit-forming material. However, in general, the heating temperature is 150 to 180° C., and the heating time is 1 to 4 hours.

Figure 12:
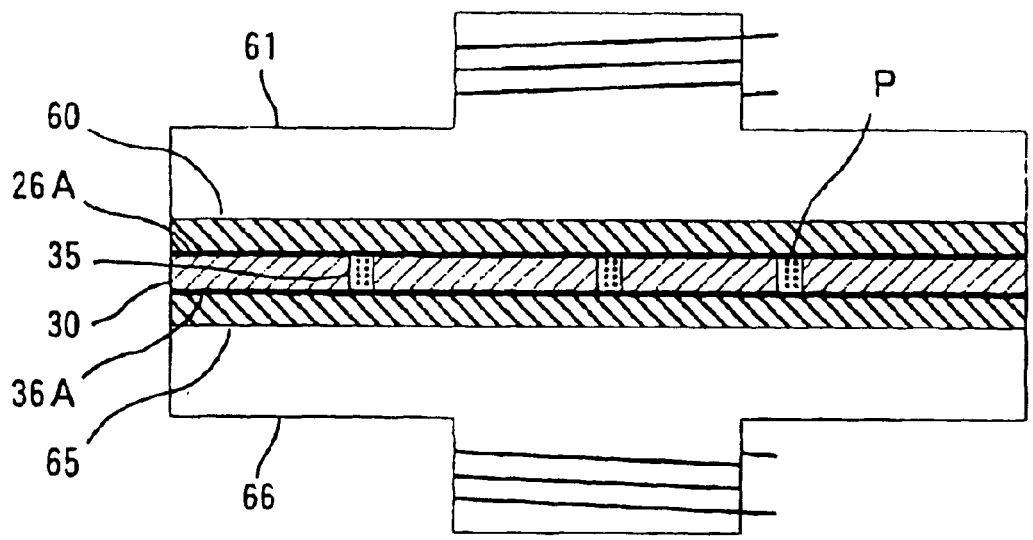
FIG. 12 is a cross-sectional view illustrating a state that a second insulating layer and second interlayer short circuit parts have been formed.

As described above, the parallel magnetic field is applied to the short circuit-forming material layer 35A in the thickness-wise direction thereof, whereby the specific conductive particles P dispersed in the short circuit-forming material layer 35A are oriented so as to be arranged in the thickness-wise direction of the short circuit-forming material layer 35A, and the second insulating layer-forming material 30A and the short circuit-forming material layer 35A are cured by the heat treatment, whereby the second insulating layer 30 and the second interlayer short circuit parts 35 are formed as illustrated in FIG. 12, and further the metal foils 26B and 36B are integrally fixed on the upper surface and lower surface of the second insulating layer 30, respectively, thereby thus obtaining a laminate in which a thin metal layer 26A, the second insulating layer 30 and a thin metal layer 36A have been laminated on one another in this order from above.

Figure 13:
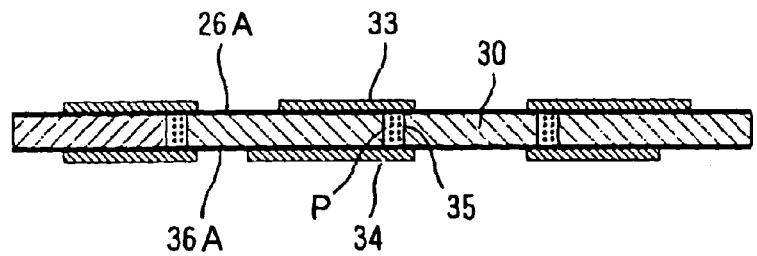
FIG. 13 is a cross-sectional view illustrating a state that a resist layer has been formed on each thin metal layer.
Figure 14:
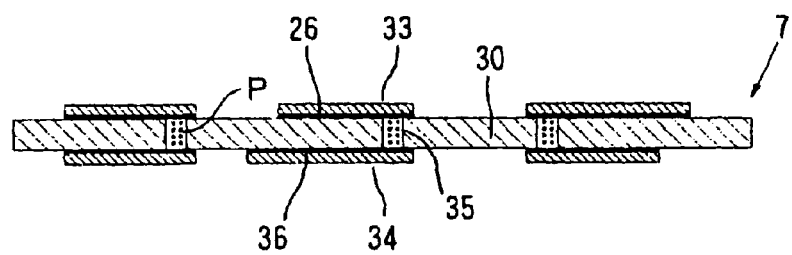
FIG. 14 is a cross-sectional view illustrating a state that a first inner wiring layer and a second inner wiring layer have been formed to form an intermediate base.

As illustrated in FIG. 13, resist layers 33 and 34 are formed on the thin metal layers 26A and 36A provided on the upper and lower surfaces of the second insulating layer 30, respectively, so as to cover portions which will become a first inner wiring layer and a second inner wiring layer, and exposed portions of the thin metal layers 26A and 36A are removed by an etching treatment, thereby forming a first inner wiring layer 26 and a second inner wiring layer 36 between the second insulating layer 30 and the resist layers 33, 34, respectively. Thus, an intermediate base 7 having the first inner wiring layer 26 and the second inner wiring layer 36 on both surfaces of the second insulating layer 30 is obtained. Thereafter, the resist layers 33, 34 are removed from the surfaces of the first inner wiring layer 26 and the second inner wiring layer 36.

Figure 15A:
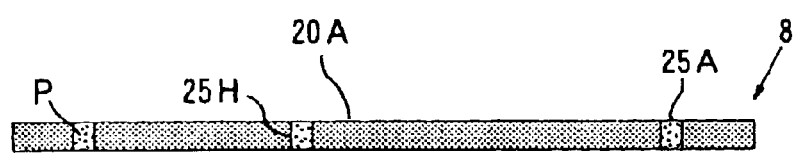
FIGS. 15A and 15B are cross-sectional views illustrating the construction of an intermediate material for a first insulating layer and the construction of an intermediate material for a third insulating layer, respectively.
Figure 15B:
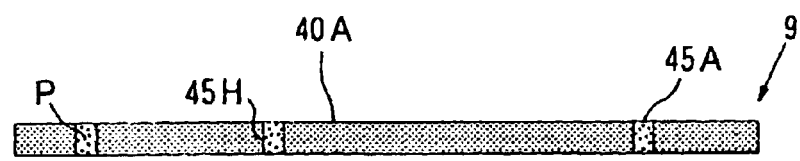

On the other hand, as illustrated in FIGS. 15A and 15B, an intermediate material 8 for a first insulating layer (illustrated in FIG. 15A) with a short circuit part-forming material layer 25A formed in each of through-holes 25H bored in a first insulating layer-forming material (material for forming a first insulating layer) 20A in the form of a sheet composed of a thermosetting resin material in a semi-cured state, and an intermediate material 9 for a third insulating layer (illustrated in FIG. 15B) with a short circuit part-forming material layer 45A formed in each of through-holes 45H bored in a third insulating layer-forming material (material for forming a third insulating layer) 40A in the form of a sheet composed of a thermosetting resin material in a semi-cured state are produced. A process for forming the short circuit part-forming material layers 25A, 45A in the first insulating layer-forming material 20A and the third insulating layer-forming material 40A may be performed in accordance with the process for forming the short circuit part-forming material layer 35A in the second insulating layer-forming material 30A.

Figure 16:
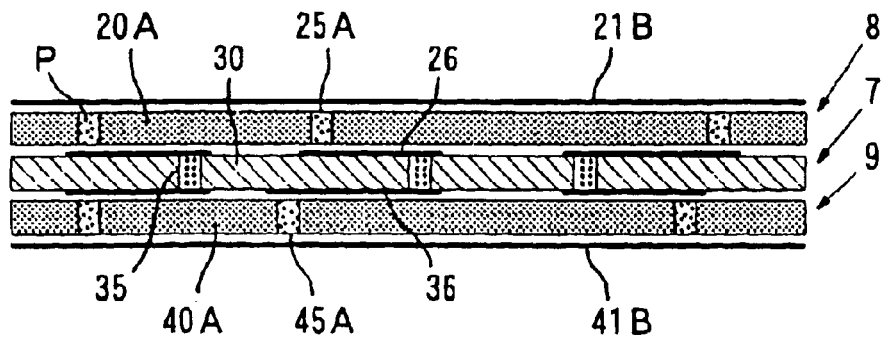
FIG. 16 is a cross-sectional view illustrating a state that a metal foil, the intermediate material for the first insulating layer, the intermediate base, the intermediate material for the third insulating layer and a metal foil have been laminated in this order.

As illustrated in FIG. 16, the intermediate material 8 for the first insulating layer is arranged on the upper surface of the intermediate base 7, and a metal foil 21B is further arranged on the upper surface of the intermediate material 8 for the first insulating layer, and moreover the intermediate material 9 for the third insulating layer is arranged on the lower surface of the intermediate base 7, and a metal foil 41B is further arranged on the lower surface of the intermediate material 9 for the third insulating layer.

Figure 17:
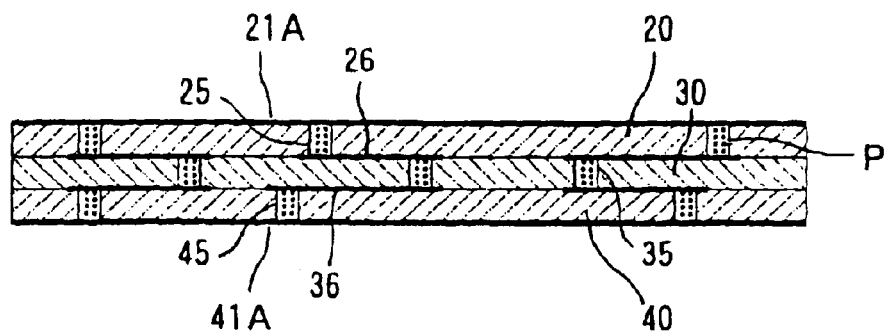
FIG. 17 is a cross-sectional view illustrating a state that the first insulating layer, the third insulating layer, first interlayer short circuit parts and third interlayer short circuit parts have been formed.

The first insulating layer-forming material 20A, the third insulating layer-forming material 40A, the short circuit-forming material layer 25A and the short circuit-forming material layer 45A are subjected to a heat treatment while applying a parallel magnetic field to the short circuit-forming material layer 25A and the short circuit-forming material layer 45A in the thickness-wise direction thereof in a state that the metal foil 21B, the intermediate material 8 for the first insulating layer, the intermediate base 7, the intermediate material 9 for the third insulating layer and the metal foil 41B are pressurized in the thickness-wise direction thereof, thereby forming a first insulating layer 20, a third insulating layer 40, a first interlayer short circuit part 25 and a third interlayer short circuit part 35 as illustrated in FIG. 17. Further, the first insulating layer 20 and the third insulating layer 40 are integrally fixed on the upper surface and lower surface of the second insulating layer 30, respectively, and moreover the metal foil 21B is integrally fixed on the upper surface of the first insulating layer 20 and the metal foil 41B is integrally fixed on the lower surface of the third insulating layer 40, thereby thus obtaining a laminate in which a thin metal layer 21A, the first insulating layer 20, the second insulating layer 30, the third insulating layer 40 and a thin metal layer 41A are laminated on one another in this order from above.

Figure 18:
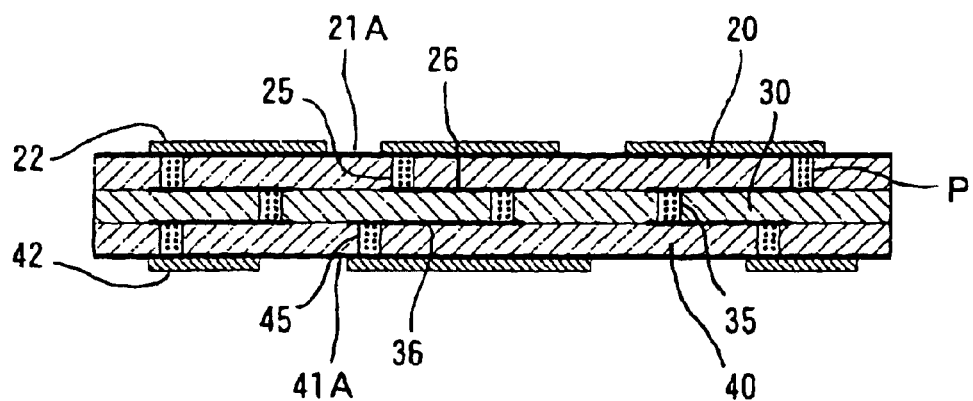
FIG. 18 is a cross-sectional view illustrating a state that a resist layer has been formed on each thin metal layer.
Figure 19:
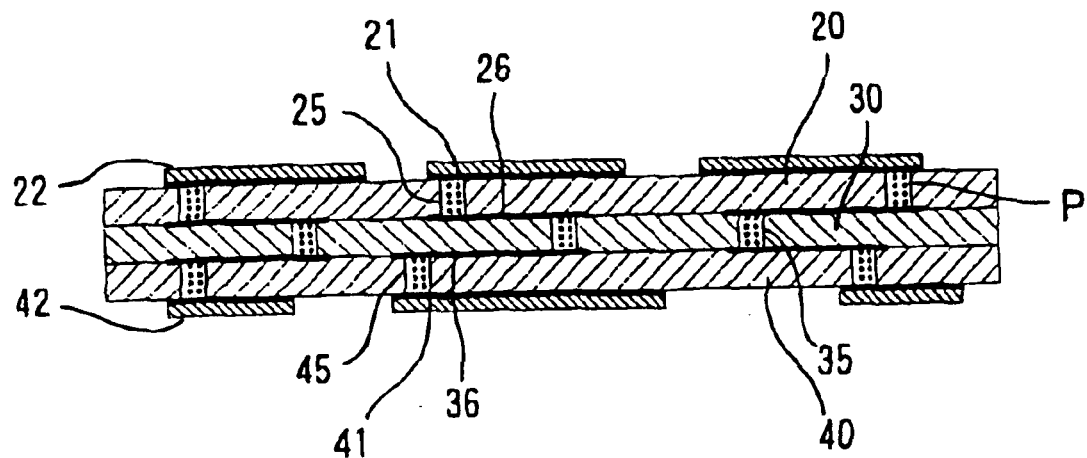
FIG. 19 is a cross-sectional view illustrating a state that an upper-side wiring layer and a lower-side wiring layer have been formed.

As illustrated in FIG. 18, resist layers 22 and 42 are formed on the thin metal layers 21A and 41A provided on the upper surface of the first insulating layer 20 and the lower surface of the third insulating layer 40, respectively, so as to cover portions which will become an upper-side wiring layer and a lower-side wiring layer, and exposed portions of the thin metal layers 21A and 41A are removed by an etching treatment, thereby forming an upper-side wiring layer 21 between the first insulating layer 20 and the resist layer 22, and a lower-side wiring layer 41 between the third insulating layer 40 and the resist layer 42, as illustrated in FIG. 19. Thereafter, the resist layers 22, 42 are removed, thereby obtaining a circuit board of the construction shown in FIG. 6.

According to such a circuit board, high conductivity is achieved in the first interlayer short circuit parts 25, the second interlayer short circuit parts 35 and the third interlayer short circuit part 45, since such interlayer short circuit parts contain the specific conductive particles P, and high reproductivity as to the conductivity thereof is achieved. Accordingly, high connection reliability is achieved.

Since the specific conductive particles P are contained in a state oriented so as to be arranged in the thickness-wise direction of each insulating layer, a conductive path is formed by a chain of the specific conductive particles P in each interlayer short circuit part. As a result, still higher conductivity is achieved.

In the formation of each of the first interlayer short circuit parts 25, the second interlayer short circuit parts 35 and the third interlayer short circuit parts 45, photolithography is useless because the short circuit-forming material composed of the conductive paste composition is used. Therefore, the first interlayer short circuit parts 25, the second interlayer short circuit parts 35 and the third interlayer short circuit parts 35 can be formed by a simple process, and moreover still higher connection reliability is achieved because no chemical is used.

In addition, conductive particles exhibiting magnetism are used as the specific conductive particles P making up each short circuit part, whereby the specific conductive particles P can be easily oriented so as to be arranged in the thickness-wise direction of each insulating layer by applying a magnetic field to the short circuit-forming material layers 25A, 35A and 45A.

Further, the respective insulating layer-forming materials and short circuit part-forming material layers are subjected to a heat treatment while applying a magnetic field to the respective short circuit part-forming material layers under pressure, whereby the specific conductive particles P can be surely oriented so as to be arranged in the thickness-wise direction of each insulating layer concerned.

In the present invention, a thermosetting resin or rubber low in elastic modulus is used as an organic polymeric substance forming the interlayer short circuit parts, thereby bring about the following effect. Namely, when a multi-layer printed circuit board is constructed, in which insulating layers different in material from each other are laminated, stress to be caused at interlayer short circuit parts due to a difference in coefficient of thermal expansion between the materials for forming the respective insulating layers can be relaxed by the elastic force of the interlayer short circuit parts.

Such a circuit board is suitable for use as a circuit board for electronic part for forming an electronic part such as a chip carrier or MCM, a circuit board for mounting electronic parts, such as a mother board for example, or an adapter used in electrical inspection for circuit devices.

[Conductive Connection Structure]

Figure 20:
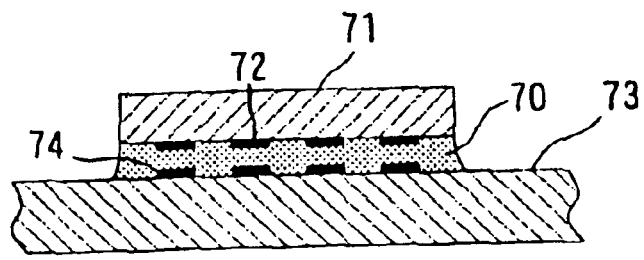
FIG. 20 is a cross-sectional view illustrating the construction of an exemplary conductive connection structure according to the present invention.

FIG. 20 is a cross-sectional view illustrating the construction of an exemplary conductive connection structure according to the present invention. In this conductive connection structure, an electronic part 71 is fixed on a circuit board 73 by a connecting member 70 formed by the conductive paste composition described above, and electrodes 72 of the electronic part 71 are electrically connected to electrodes 74 of the circuit board 73 through the connecting member 70.

No particular limitation is imposed on the electronic part 71, and various electronic parts may be used. Examples thereof include active parts composed of each of semiconductor devices such as transistors, diodes, relays, switches, IC chips or LSI chips or packages thereof, and MCM (multi chip module); passive parts such as resistors, capacitors, quartz oscillators, speakers, microphones, transformers (coils) and inductors; and display panels such as TFT type liquid crystal display panels, STN type liquid crystal display panels, plasma display panels and electroluminescence panels.

As the circuit board 73, may be used any of various structures such as single-side printed circuit boards, double-side printed circuit boards and multi-layer printed circuit boards. The circuit board 73 may be any of a flexible board, a rigid board and a flexible-rigid board composed of a combination thereof.

As a material for forming the flexible board, may be used polyimide, polyamide, polyester, polysulfone or the like.

As a material for forming the rigid board, may be used a composite resin material such as a glass fiber-reinforced epoxy resin, glass fiber-reinforced phenol resin, glass fiber-reinforced polyimide resin or glass fiber-reinforced bismaleimidotriazine resin, or a ceramic material such as silicon dioxide or alumina.

Examples of materials for the electrodes 72 in the electronic part 71 and the electrodes 74 in the circuit board 73 include gold, silver, copper, nickel, palladium, carbon, aluminum and ITO.

The thicknesses of the electrodes 72 in the electronic part 71 and the electrodes 74 in the circuit board 73 are each preferably 0.1 to 100 $\mu$m.

The widths of the electrodes 72 in the electronic part 71 and the electrodes 74 in the circuit board 73 are each preferably 1 to 500 $\mu$m.

Such a conductive connection structure can be fabricated by coating surface or surfaces of one or both of the electronic part 71 and the circuit board 73 with the conductive paste composition described above, arranging the electronic part 71 on the surface of the circuit board 73 in an aligned state and then subjecting the conductive paste composition to a curing treatment or drying treatment, or by forming the conductive paste composition into a film, making the film a semi-cured state and then arranging this film between the electronic part 71 and the circuit board 73 to conduct a curing treatment.

When conductive particles exhibiting magnetism are used as the specific conductive particles, the specific conductive particles can be oriented so as to be arranged in the thickness-wise direction by applying a magnetic field to the conductive paste composition in the thickness-wise direction thereof before conducting a curing treatment or drying treatment of the conductive paste composition or while conducting such a treatment, whereby electrical connection can be achieved with higher conductivity.

Figure 21:
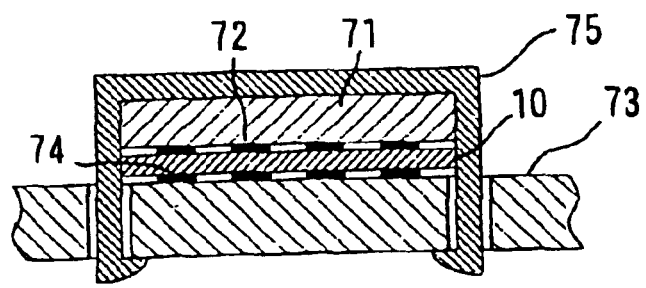
FIG. 21 is a cross-sectional view illustrating the construction of another exemplary conductive connection structure according to the present invention.

FIG. 21 is a cross-sectional view illustrating the construction of another exemplary conductive connection structure according to the present invention. In this conductive connection structure, an electronic part 71 is arranged on a circuit board 73 with an interposed anisotropically conductive sheet 10, for example, of the construction shown in FIG. 2. The anisotropically conductive sheet 10 is fixed by a fixing member 75 in a state held pressurized by and between the electronic part 71 and the circuit board 73. Electrodes 72 in the electronic part 71 are electrically connected to electrodes 74 in the circuit board 73 through conductive parts 11 in the anisotropically conductive sheet 10.

According to such a conductive connection structure as described above, the electronic part 71 is connected to the circuit board 73 through the connecting member 70 formed by the conductive paste composition, or through the anisotropically conductive sheet 10, as described above. Therefore, electrical connection high in conductivity and reproductivity thereof can be achieved between the electronic part 71 and the circuit board 73.

[Electrical Inspection Apparatus of Circuit Device]

Figure 22:
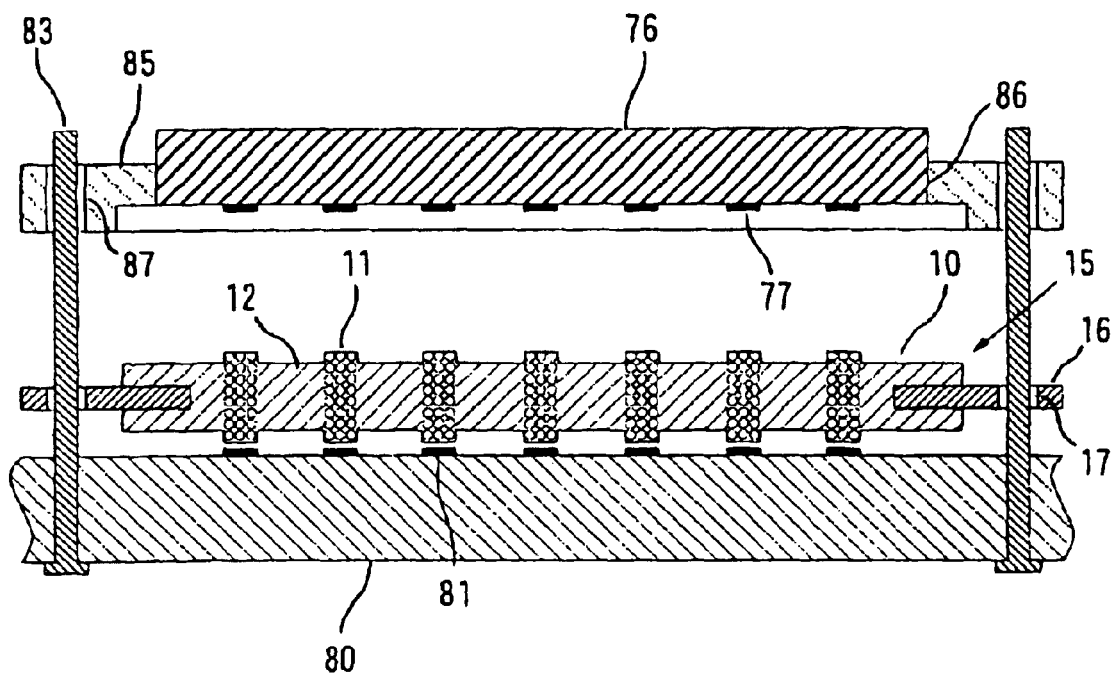
FIG. 22 is a cross-sectional view illustrating the construction of principal parts of an exemplary electrical inspection apparatus for circuit devices according to the present invention.

FIG. 22 is a cross-sectional view illustrating the construction of principal parts of an exemplary electrical inspection apparatus for circuit devices according to the present invention.

In FIG. 22, reference numeral 80 indicates an adapter composed of a printed circuit board. Electrodes 81 for inspection are arranged on the surface (upper surface in FIG. 22) of the adapter 80 according to a pattern corresponding to electrodes 77 to be inspected in a circuit device 76 to be inspected. This adapter 80 is provided with a plurality of positioning pins 83 extending perpendicularly to the surface of the adapter 80.

Reference numeral 15 indicates a connector in the form of a sheet, which is constructed by an anisotropically conductive sheet 10 of the structure shown in FIG. 2 and a frame-like support 16 for supporting the peripheral part of the anisotropically conductive sheet 10. Positioning holes 17 are formed correspondingly to the positioning pins 83 in the support 16. This connector 15 is arranged on the surface of the adapter 80 in a state positioned by inserting the positioning pins through the positioning holes 17 in the support 16 thereof.

Reference numeral 85 designates a holding plate for holding the circuit device 76 to be inspected. An opening 86, in which the circuit device 76 to be inspected is arranged, is defined at the center thereof, and positioning holes 87 are formed correspondingly to the positioning pins 83 at peripheral portions thereof. This holding plate 85 is arranged above the sheet-like connector 15 in a state positioned by slidably movably inserting the positioning pins 83 through the positioning holes 87.

Examples of the circuit device 76 to be inspected, which is an inspection target, include wafers, semiconductor chips, packages such as BGA and CSP, modules such as MCM, and circuit boards such as single-side printed circuit boards, double-side printed circuit boards and multi-layer printed circuit boards.

In such an electrical inspection apparatus, the circuit device 76 to be inspected is fixed in the opening 86 in the holding member 85, and the circuit device 76 to be inspected is moved in a direction (downward direction in FIG. 22) coming close to the connector 15, so that a state is accomplished wherein the anisotropically conductive sheet 10 in the connector 15 is pressurized by and between the circuit device 76 to be inspected and the adapter 80. As a result, electrical connection between the electrodes 77 to be inspected in the circuit device 76 to be inspected and the electrodes 81 for inspection in the adapter 80 is achieved through the conductive parts 11 in the anisotropically conductive sheet 10.

In this state, or in a state that the environmental temperature has been raised to a predetermined temperature, for example, 150° C. for the purpose of developing latent defects of the circuit device 76 to be inspected, electrical inspection required for the circuit device 76 to be inspected is conducted.

According to such an electrical inspection apparatus for circuit devices as described above, electrical connection high in conductivity and reproductivity thereof can be achieved to the circuit device 76 to be inspected because the apparatus has the anisotropically conductive sheet 10. Therefore, electrical inspection high in reliability can be conducted.

The present invention will hereinafter be described specifically by the following examples. However, the present invention is not limited to these examples.

[Preparation of Conductive Metal Particles [A]]

Commercially available nickel particles (product of Westaim Co., "FC1000") were used to prepare Conductive Metal Particles [A] according to the present invention in the following manner.

An air classifier "Turboclassifier TC-15N" (manufactured by Nissei Engineering Co., Ltd.) was used to classify 2 kg of nickel particles under conditions of a specific gravity of 8.9, an air flow rate of 2.5 m$^3$/min, a rotor speed of 2250 rpm, a classification point of 15 μm and a feed rate of nickel particles of 50 g/min, thereby collecting 1.1 kg of nickel particles, and 1.1 kg of the nickel particles were further classified under conditions of a specific gravity of 8.9, an air flow rate of 2.5 m$^3$/min, a rotor speed of 3750 rpm, a classification point of 7 μm and a feed rate of nickel particles of 50 g/min to collect 0.8 kg of nickel particles.

A sonic sifter "SW-20AT Model" (manufactured by Tsutsui Rikagaku Kiki K. K.) was then used to further classify 500 g of the nickel particles classified by the air classifier. Specifically, 4 sieves each having a diameter of 200 mm and respectively having opening diameters of 32 μm, 20 μm, 12.5 μm and 8 μm were superimposed on one-another in this order from above. Each of the sieves was charged with 10 g of ceramic balls having a diameter of 2 mm, and 20 g of the nickel particles were placed on the uppermost sieve (opening diameter: 32 μm) to classify them under conditions of 112 Hz for 15 minutes and 224 Hz for 15 minutes, thereby collecting nickel particles captured on the lowest sieve (opening diameter: 8 μm). This process was conducted repeatedly 25 times in total, thereby preparing 10 g of Conductive Metal Particles [A] according to the present invention.

The Conductive Metal Particles [A] thus obtained had a number average particle diameter of 10 μm, a coefficient of variation of the particle diameter of 10%, a BET specific surface area of $0.5 \times 10^3$ m²/kg, a sulfur element content of 0.05% by mass, an oxygen element content of 0.02% by mass, a carbon element content of 0.03% by mass and a saturation magnetization of 0.6 Wb/m².

[Preparation of Conductive Metal Particles [B] to [G]]

The following-Conductive Metal Particles [B] to [G] were prepared in the same manner as in the preparation of Conductive Metal Particles [A] except that the conditions of the air classifier and the sonic sifter were changed.

Conductive Metal Particles [B] (Invention):

Conductive metal particles composed of nickel having a number average particle diameter of 65 μm, a coefficient of variation of the particle diameter of 40%, a BET specific surface area of $0.03 \times 10^3$ m²/kg, a sulfur element content of 0.08% by mass, an oxygen element content of 0.02% by mass, a carbon element content of 0.05% by mass and a saturation magnetization of 0.6 Wb/m².

Conductive Metal Particles [C] (Comparative):

Conductive metal particles composed of nickel having a number average particle diameter of 120 μm, a coefficient of variation of the particle diameter of 48%, a BET specific surface area of $0.02 \times 10^3$ m²/kg, a sulfur element content of 0.07% by mass, an oxygen element content of 0.2% by mass, a carbon element content of 0.04% by mass and a saturation magnetization of 0.6 Wb/m².

Conductive Metal Particles [D] (Comparative):

Conductive metal particles composed of nickel having a number average particle diameter of 4 μm, a coefficient of variation of the particle diameter of 7%, a BET specific surface area of $0.7 \times 10^3$ m²/kg, a sulfur element content of 0.03% by mass, an oxygen element content of 0.1% by mass, a carbon element content of 0.03% by mass and a saturation magnetization of 0.6 Wb/m².

Conductive Metal Particles [E] (Comparative):

Conductive metal particles composed of nickel having a number average particle diameter of 5 μm, a coefficient of variation of the particle diameter of 47%, a BET specific surface area of $0.9 \times 10^3$ m²/kg, a sulfur element content of 0.07% by mass, an oxygen element content of 0.2% by mass, a carbon element content of 0.04% by mass and a saturation magnetization of 0.6 Wb/m².

Conductive Metal Particles [F] (Comparative):

Conductive metal particles composed of nickel having a number average particle diameter of 73 μm, a coefficient of variation of the particle diameter of 58%, a BET specific surface area of $0.05 \times 10^3$ m²/kg, a sulfur element content of 0.1% by mass, an oxygen element content of 0.6% by mass, a carbon element content of 0.12% by mass and a saturation magnetization of 0.6 Wb/m².

Conductive Metal Particles [G] (Comparative):

Conductive metal particles composed of nickel having a number average particle diameter of 48 μm, a coefficient of variation of the particle diameter of 32%, a BET specific surface area of $0.08 \times 10^3$ m²/kg, a sulfur element content of 0.14% by mass, an oxygen element content of 0.8% by mass, a carbon element content of 0.13% by mass and a saturation magnetization of 0.6 Wb/m².

[Preparation of Conductive Composite Metal Particles [a1]]

Into a treating vessel of a powder plating apparatus, were poured 100 g of Conductive Metal Particles [A], and 2 L of 0.32N hydrochloric acid were added. The resultant mixture was stirred to obtain a slurry containing Conductive Metal Particles [A]. This slurry was stirred at normal temperature for 30 minutes, thereby conducting an acid treatment for Conductive Metal Particles [A]. Thereafter, the slurry thus treated was left at rest for 1 minute to precipitate Conductive Metal Particles [A], and a supernatant was removed.

To the Conductive Metal Particles [A] subjected to the acid treatment, were added 2 L of purified water, and the mixture was stirred for 2 minutes. The mixture was then left at rest for 1 minute to precipitate Conductive Metal Particles [A], and a supernatant was removed. This process was conducted repeatedly twice, thereby conducting a washing treatment for Conductive Metal Particles [A].

To the Conductive Metal Particles [A] subjected to the acid treatment and washing treatment, were added 2 L of a plating solution containing gold in a proportion of 20 g/L. The temperature of the treating vessel was raised to 90° C. and stirred, thereby preparing a slurry. While stirring the slurry in this state, Conductive Metal Particles [A] was subjected to plating with gold. Thereafter, the slurry was left at rest while allowing it to cool, thereby precipitating particles, and a supernatant was removed to prepare Conductive Composite Metal Particles [a1] according to the present invention.

To the Conductive Composite Metal Particles [a1] thus obtained, were added 2 L of purified water, and the mixture was stirred at normal temperature for 2 minutes. Thereafter, the mixture was left at rest for 1 minute to precipitate Conductive Composite Metal Particles [a1], and a supernatant was removed. This process was conducted repeatedly further twice, and 2 L of purified water heated to 90° C. were added to the particles, and the mixture was stirred. The resultant slurry was filtered through filter paper to collect Conductive Composite Metal Particles [a1]. The Conductive Composite Metal Particles [a1] thus obtained was dried in a dryer set at 90° C.

The Conductive Composite Metal Particles [a1] thus obtained had a number average particle diameter of 15 μm, a BET specific surface area of $0.2 \times 10^3$ m²/kg, a thickness t of the coating layer of 89 nm, a gold content at the surface layer portion of 82% by mass and an electric resistance value R of 0.03 Ω.

[Preparation of Conductive Composite Metal Particles [a2]]

Conductive Composite Metal Particles [a2] for reference were prepared in the same manner as in the preparation of Conductive Composite Metal Particles [a1] except that the content of gold in the plating solution was changed to 5 g/L.

The Conductive Composite Metal Particles [a2] thus obtained had a number average particle diameter of 12 μm, a BET specific surface area of $0.4 \times 10^3$ m²/kg, a thickness t of the coating layer of 8 nm, a gold content at the surface layer portion of 38% by mass and an electric resistance value R of 5 Ω.

[Preparation of Conductive Composite Metal Particles [b1] and [b2]]

The following Conductive Composite Metal Particles [b1] and [b2] were prepared in the same manner as in the preparation of Conductive Composite Metal Particles [a1] except that Conductive Metal Particles [B] were used in place of Conductive Metal Particles [A], and the content of gold in the plating solution was changed.

Conductive Composite Metal Particles [b1] (Invention):

Conductive composite metal particles having a number average particle diameter of 72 μm, a BET specific surface area of $0.02 \times 10^3$ m²/kg, a thickness t of the coating layer of 65 nm, a gold content at the surface layer portion of 66% by mass and an electric resistance value R of 0.1 Ω.

Conductive Composite Metal Particles [b2] (Reference):

Conductive composite metal particles having a number average particle diameter of 130 μm, a BET specific surface area of $0.009 \times 10^3$ m²/kg, a thickness t of the coating layer of 57 nm, a gold content at the surface layer portion of 63% by mass and an electric resistance value R of 1.1 Ω.

[Preparation of Conductive Composite Metal Particles [c1]]

The following Conductive Composite Metal Particles [c1] were prepared in the same manner as in the preparation of Conductive Composite Metal Particles [a1] except that Conductive Metal Particles [C] were used in place of Conductive Metal Particles [A], and the content of gold in the plating solution was changed.

Conductive Composite Metal Particles [c1] (Comparative):

Conductive composite metal particles having a number average particle diameter of 127 $\mu$m, a BET specific surface area of $0.01 \times 10^3$ m$^2$/kg, a thickness t of the coating layer of 52 nm, a gold content at the surface layer portion of 57% by mass and an electric resistance value R of 0.3 Ω.

[Preparation of Conductive Composite Metal Particles [d1]]

The following Conductive Composite Metal Particles [d1] were prepared in the same manner as in the preparation of Conductive Composite Metal Particles [a1] except that Conductive Metal Particles [D] were used in place of Conductive Metal Particles [A], and the content of gold in the plating solution was changed.

Conductive Composite Metal Particles [d1] (Comparative):

Conductive composite metal particles having a number average particle diameter of 6 $\mu$m, a BET specific surface area of $0.6 \times 10^3$ m$^2$/kg, a thickness t of the coating layer of 37 nm, a gold content at the surface layer portion of 33% by mass and an electric resistance value R of 2 Ω.

[Preparation of Conductive Composite Metal Particles [e1]]

The following Conductive Composite Metal Particles [e1] were prepared in the same manner as in the preparation of Conductive Composite Metal Particles [a1] except that Conductive Metal Particles [E] were used in place of Conductive Metal Particles [A], and the content of gold in the plating solution was changed.

Conductive Composite Metal Particles [e1] (Comparative):

Conductive composite metal particles having a number average particle diameter of 6 $\mu$m, a BET specific surface area of $0.8 \times 10^3$ m$^2$/kg, a thickness t of the coating layer of 77 nm, a gold content at the surface layer portion of 69% by mass and an electric resistance value R of 0.5 Ω.

[Preparation of Conductive Composite Metal Particles [f1]]

The following Conductive Composite Metal Particles [f1] were prepared in the same manner as in the preparation of Conductive Composite Metal Particles [a1] except that Conductive Metal Particles [F] were used in place of Conductive Metal Particles [A], and the content of gold in the plating solution was changed.

Conductive Composite Metal Particles [f1] (Comparative):

Conductive composite metal particles having a number average particle diameter of 79 $\mu$m, a BET specific surface area of $0.06 \times 10^3$ m$^2$/kg, a thickness t of the coating layer of 74 nm, a gold content at the surface layer portion of 67% by mass and an electric resistance value R of 0.8 Ω.

[Preparation of Conductive Composite Metal Particles [g1]]

The following Conductive Composite Metal Particles [g1] were prepared in the same manner as in the preparation of Conductive Composite Metal Particles [a1] except that Conductive Metal Particles [G] were used in place of Conductive Metal Particles [A], and the content of gold in the plating solution was changed.

Conductive Composite Metal Particles [g1] (Comparative):

Conductive composite metal particles having a number average particle diameter of 53 $\mu$m, a BET specific surface area of $0.05 \times 10^3$ m$^2$/kg, a thickness t of the coating layer of 75 nm, a gold content at the surface layer portion of 82% by mass and an electric resistance value R of 0.4 Ω.

The properties of the conductive composite metal particles prepared and the properties of the conductive metal particles used in the preparation of the conductive composite metal particles are shown collectively in Table 1.

TABLE 1

| | | Properties of Conductive Metal Particles used | | | | | | Properties of Conductive Composite Metal Particles | | | | |
|---|---|---|---|---|---|---|---|---|---|---|---|---|
| Conductive Composite Metal Particles | Kind | Number Average Particle Diameter ($\mu$m) | Coefficient of Variation of Particle Diameter (%) | BET Specific Surface Area (m$^2$/kg) | Element Content | | | Saturation Magnetization (wb/m$^2$) | Number Average Particle Diameter ($\mu$m) | BET Specific Surface Area (m$^2$/kg) | Thickness of Coating Layer (nm) | Gold Content at Surface Layer Portion (%) | Electric Resistance Value R (Ω) |
| | | | | | Sulfur | Oxygen | Carbon | | | | | | |
| Invention | | | | | | | | | | | | | |
| [a 1] | [A] | 10 | 10 | $0.5 \times 10^3$ | 0.05 | 0.02 | 0.03 | 0.6 | 15 | $0.2 \times 10^3$ | 89 | 82 | 0.03 |
| [b 1] | [B] | 65 | 40 | $0.03 \times 10^3$ | 0.08 | 0.2 | 0.05 | 0.6 | 72 | $0.02 \times 10^3$ | 65 | 66 | 0.1 |
| Reference | | | | | | | | | | | | | |
| [a 2] | [A] | 10 | 10 | $0.5 \times 10^3$ | 0.05 | 0.02 | 0.03 | 0.6 | 12 | $0.4 \times 10^3$ | 8 | 38 | 5 |
| [b 2] | [B] | 65 | 40 | $0.03 \times 10^3$ | 0.08 | 0.2 | 0.05 | 0.6 | 130 | $0.009 \times 10^3$ | 57 | 63 | 1.1 |
| Comparative | | | | | | | | | | | | | |
| [c 1] | [C] | 120 | 48 | $0.02 \times 10^3$ | 0.07 | 0.2 | 0.04 | 0.6 | 127 | $0.01 \times 10^3$ | 52 | 57 | 0.3 |
| [d 1] | [D] | 4 | 7 | $0.7 \times 10^3$ | 0.03 | 0.1 | 0.03 | 0.6 | 6 | $0.6 \times 10^3$ | 37 | 33 | 2 |
| [e 1] | [E] | 5 | 47 | $0.9 \times 10^3$ | 0.07 | 0.2 | 0.04 | 0.6 | 6 | $0.8 \times 10^3$ | 77 | 69 | 0.5 |
| [f 1] | [F] | 73 | 58 | $0.05 \times 10^3$ | 0.1 | 0.6 | 0.12 | 0.6 | 79 | $0.06 \times 10^3$ | 74 | 67 | 0.8 |
| [g 1] | [G] | 48 | 32 | $0.08 \times 10^3$ | 0.14 | 0.8 | 0.13 | 0.6 | 53 | $0.05 \times 10^3$ | 75 | 82 | 0.4 |

[Preparation of Conductive Paste Composition]

PREPARATION EXAMPLE 1

Liquid A and Liquid B of addition type liquid silicone rubber "KE1950-40" (product of Shin-Etsu Chemical Co., Ltd.) were mixed with each other in equal proportions (in terms of weight), and 100 parts by weight of Conductive Composite Metal Particles [a1] were then added to 100 parts by weight of this mixture. The resultant mixture was subjected to a defoaming treatment by pressure reduction, thereby preparing Conductive Paste Composition (1) according to the present invention.

With respect to the addition type liquid silicone rubber "KE1950-40", the viscosities (as determined by a Brookfield type viscometer) of Liquid A and Liquid B at 23° C. are both 4,800 P, the compression permanent set (JIS K 6249) at 150° C. of the cured product thereof is 20%, the durometer hardness A (JIS K 6249) at 23° C. is 42, and the tensile strength (JIS K 6249, crescent type) is 35.6 kgf/cm.

PREPARATION EXAMPLE 2

Conductive Paste Composition (2) according to the present invention was prepared in the same manner as in Preparation Example 1 except that Conductive Composite Metal Particles [b1] were used in place of Conductive Composite Metal Particles [a1].

COMPARATIVE PREPARATION EXAMPLE 3

A comparative Conductive Paste Composition (3) was prepared in the same manner as in Preparation Example 1 except that Conductive Composite Metal Particles [c1] were used in place of Conductive Composite Metal Particles [a1].

COMPARATIVE PREPARATION EXAMPLE 2

A comparative Conductive Paste Composition (4) was prepared in the same manner as in Preparation Example 1 except that Conductive Composite Metal Particles [d1] were used in place of Conductive Composite Metal Particles [a1].

COMPARATIVE PREPARATION EXAMPLE 3

A comparative Conductive Paste Composition (5) was prepared in the same manner as in Preparation Example 1 except that Conductive Composite Metal Particles [e1] were used in place of Conductive Composite Metal Particles [a1].

COMPARATIVE PREPARATIVE EXAMPLE 4

A comparative Conductive Paste Composition (6) was prepared in the same manner as in Preparation Example 1 except that Conductive Composite Metal Particles [f1] were used in place of Conductive Composite Metal Particles [a1].

COMPARATIVE PREPARATION EXAMPLE 5

A comparative Conductive Paste Composition (7) was prepared in the same manner as in Preparation Example 1 except that Conductive Composite Metal Particles [g1] were used in place of Conductive Composite Metal Particles [a1].

REFERENTIAL PREPARATION EXAMPLE 1

A referential Conductive Paste Composition (8) was prepared in the same manner as in Preparation Example 1 except that Conductive Composite Metal Particles [a2] were used in place of Conductive Composite Metal Particles [a1].

REFERENTIAL PREPARATION EXAMPLE 2

A referential Conductive Paste Composition (9) was prepared in the same manner as in Preparation Example 1 except that Conductive Composite Metal Particles [b2] were used in place of Conductive Composite Metal Particles [a1].

[Evaluation of Conductive Paste Composition]

The Conductive Paste Compositions (1) to (9) according to Preparation Examples 1 and 2, Comparative Preparation Examples 1 to 5 and Referential Preparation Examples 1 and 2 were evaluated in the following manner.

A circuit board having a lead electrode region, in which 240 linear lead electrodes each having a width of 0.15 mm and composed of copper were arranged in parallel with one another at a pitch of 0.25 mm (clearance: 0.1 mm), was provided, and a conductive paste composition sample was coated on the lead electrode region of the circuit board by screen printing, thereby forming a coating layer having a width of 1.0 mm and a thickness of about 0.3 mm and extending in a direction perpendicular to the direction in which the lead electrodes extend. While applying a parallel magnetic field to the coating layer in the thickness-wise direction thereof, the coating layer was subjected to a curing treatment under conditions of 150° C. and 1 hour, thereby forming an anisotropically conductive connection member integrally provided on the lead electrode region of the circuit board.

A flat board, on the whole surface of which a common electrode composed of a gold-plated layer had been formed, was arranged on the connection member, and this flat board was pressed down by a pressing plate connected to a load cell. In this state, electric resistances between the lead electrodes of the circuit board and the common electrode of the flat board were measured to find the maximum value, minimum value and average value thereof.

Further, the flat board was pressed down repeatedly at a cycle of 1 Hz under an environment of 25° C. in temperature and 30% in relative humidity, thereby measuring electric resistances between the lead electrodes of the circuit board and the common electrode of the flat board after pressing 10,000 times to find the average value thereof.

The results are shown in Table 2.

TABLE 2

| Kind of Conductive Composite Metal Particles | | Electric Registance (Ω) | | | |
|---|---|---|---|---|---|
| | | Initial | | | After Pressing 10,000 Times Average Value |
| | | Average Value | Maximum Value | Minimum Value | |
| Invention | | | | | |
| Conductive Paste Composition (1) | [a 1] | 0.500 | 0.869 | 0.120 | 0.988 |
| Conductive Paste Composition (2) | [b 1] | 0.642 | 0.996 | 0.251 | 1.322 |
| Comparative | | | | | |
| Conductive Paste Composition (3) | [c 1] | 1.820 | 3.045 | 0.159 | 9.233 |
| Conductive Paste Composition (4) | [d 1] | 2.880 | 3.208 | 0.370 | 25.247 |
| Conductive Paste Composition (5) | [e 1] | 2.149 | 2.562 | 0.275 | 15.946 |
| Conductive Paste Composition (6) | [f 1] | 0.651 | 1.022 | 0.184 | 23.219 |
| Conductive Paste Composition (7) | [g 1] | 0.678 | 0.963 | 0.165 | 38.716 |
| Reference | | | | | |
| Conductive Paste Composition (8) | [a 2] | 20.392 | 33.667 | 9.339 | 300.551 |
| Conductive Paste Composition (9) | [b 2] | 2.500 | 4.859 | 0.271 | 20.118 |

[Production of Anisotropically Conductive Sheet]

A mold for production of anisotropically conductive sheets was fabricated under the following conditions in accordance with the construction basically shown in FIG. 3 except that a space region for arrangement of a support was provided in a cavity.

Base plate: material; iron, thickness; 8 mm
Ferromagnetic layer: material; nickel, thickness; 0.1 mm, diameter; 0.25 mm, pitch (center distance); 0.5 mm
Material of non-magnetic layer: radiation-sensitive resin, thickness; 0.15 mm,
Thickness of spacer; 0.3 mm

PRODUCTION EXAMPLE 1

A frame-like support for anisotropically conductive sheet composed of stainless steel and having a thickness of 0.2 mm was arranged in the space region for arrangement of the support within the cavity of the mold. Conductive Paste Composition (1) was then filled into the cavity of the mold and subjected to a defoaming treatment by pressure reduction, thereby forming a conductive composition layer in the mold.

While applying a parallel magnetic field of 6,000 G to the conductive composition layer in the thickness-wise direction by electromagnets, the conductive composition layer was subjected to a curing treatment under conditions of 100° C. for 1 hour. After removing it from the mold, post curing was conducted under conditions of 200° C. for 4 hours, thereby producing a support-equipped anisotropically conductive sheet (1) according to the present invention, which has a plurality of conductive parts each extending in the thickness-wise direction of the sheet, and insulating part insulating these conductive parts mutually.

The anisotropically conductive sheet (1) thus obtained was such that the conductive parts each having an external diameter of 0.25 mm were arranged in 16 lines and 16 rows at a pitch of 0.5 mm. The thickness of the insulating part was 0.3 mm, the thickness of each of the conductive parts was 0.4 mm, and the conductive parts were formed in a state projected (each projected height: 0.05 mm) from both surfaces of the insulating part.

PRODUCTION EXAMPLE 2

A support-equipped anisotropically conductive sheet (2) according to the present invention was produced in the same manner as in Production Example 1 except that Conductive Paste Composition (2) was used in place of Conductive Paste Composition (1).

COMPARATIVE PRODUCTION EXAMPLE 1

A comparative support-equipped anisotropically conductive sheet (3) was produced in the same manner as in Production Example 1 except that Conductive Paste Composition (3) was used in place of Conductive Paste Composition (1).

COMPARATIVE PRODUCTION EXAMPLE 2

A comparative support-equipped anisotropically conductive sheet (4) was produced in the same manner as in Production Example 1 except that Conductive Paste Composition (4) was used in place of Conductive Paste Composition (1).

COMPARATIVE PRODUCTION EXAMPLE 3

A comparative support-equipped anisotropically conductive sheet (5) was produced in the same manner as in Production Example 1 except that Conductive Paste Composition (5) was used in place of Conductive Paste Composition (1).

COMPARATIVE PRODUCTION EXAMPLE 4

A comparative support-equipped anisotropically conductive sheet (6) was produced in the same manner as in Production Example 1 except that Conductive Paste Composition (6) was used in place of Conductive Paste Composition (1).

COMPARATIVE PRODUCTION EXAMPLE 5

A comparative support-equipped anisotropically conductive sheet (7) was produced in the same manner as in Production Example 1 except that Conductive Paste Composition (7) was used in place of Conductive Paste Composition (1).

REFERENTIAL PRODUCTION EXAMPLE 1

A comparative support-equipped anisotropically conductive sheet (7) was produced in the same manner as in Production Example 1 except that Conductive Paste Composition (7) was used in place of Conductive Paste Composition (1).

REFERENTIAL PRODUCTION EXAMPLE 1

A referential support-equipped anisotropically conductive sheet (8) was produced in the same manner as in Production Example 1 except that Conductive Paste Composition (8) was used in place of Conductive Paste Composition (1).

REFERENTIAL PRODUCTION EXAMPLE 2

A referential support-equipped anisotropically conductive sheet (9) was produced in the same manner as in Production Example 1 except that Conductive Paste Composition (9) was used in place of Conductive Paste Composition (1).

[Evaluation of Conductive Paste Composition]

The anisotropically conductive sheets (1) to (9) according to Production Examples 1 and 2, Comparative Production Examples 1 to 5 and Referential Production Examples 1 and 2 were evaluated in the following manner.

(i) An anisotropically conductive sheet sample was arranged and fixed on a printed wiring board having electrodes each having a diameter of 0.25 mm and arranged in 16 lines and 16 rows according to the lattice-point positions at a pitch of 0.5 mm corresponding to the conductive parts in the anisotropically conductive sheet sample, in such a manner that the conductive parts are located on their corresponding electrodes. A flat board, on the whole surface of which a common electrode composed of a gold-plated layer had been formed, was arranged on the anisotropically conductive sheet. This flat board was pressed down under a load of 3.5 kgf by a pressing plate connected to a load cell. In this state, electric resistances (electric resistances of the conductive parts in the anisotropically conductive sheet) between the electrodes of the printed wiring board and the common electrode of the flat board were measured to find the maximum value, minimum value and average value thereof.

Further, the flat board was pressed down repeatedly at a cycle of 1 Hz under an environment of 25° C. in temperature and 30% in relative humidity, thereby measuring electric resistances between the electrodes of the printed wiring board and the common electrode of the flat board after pressing 10,000 times to find the average value thereof.

The results are shown in Table 3.

(ii) An anisotropically conductive sheet sample was arranged and fixed on a printed wiring board having electrodes each having a diameter of 0.25 mm and arranged in 16 lines and 16 rows according to the lattice-point positions at a pitch of 0.5 mm corresponding to the conductive parts in the anisotropically conductive sheet sample, in such a manner that the conductive parts are located on their corresponding electrodes. A flat board, on the whole surface of which a common electrode composed of a gold-plated layer had been formed, was arranged on the anisotropically conductive sheet. This flat board was pressed down by a pressing plate connected to a load cell, thereby compressing and deforming the conductive parts in the anisotropically conductive sheet so as to give compressive rates of 5%, 10%, 15% and 20%. In the respective states, electric resistances (electric resistances of the conductive parts in the anisotropically conductive sheet) between the electrodes of the printed wiring board and the common electrode of the flat board were measured to find the average value thereof.

The results are shown in Table 4.

TABLE 3

| Kind of Conductive | Electric Resistance (Ω) | | | |
|---|---|---|---|---|
| | Initial | | | |
| Composite Metal Particles | Average Value | Maximum Value | Minimum Value | After Pressing 10,000 Times Average Value |
| Invention | | | | |
| Anisotropically Conductive Sheet (1) | [a 1] | 0.169 | 0.235 | 0.040 | 0.208 |

TABLE 3-continued

| Kind of Conductive | Electric Resistance (Ω) | | | |
|---|---|---|---|---|
| | Initial | | | |
| Composite Metal Particles | Average Value | Maximum Value | Minimum Value | After Pressing 10,000 Times Average Value |
| Anisotropically Conductive Sheet (2) Comparative | [b 1] | 0.175 | 0.332 | 0.081 | 0.400 |
| Anisotropically Conductive Sheet (3) | [c 1] | 0.455 | 0.823 | 0.050 | 3.411 |
| Anisotropically Conductive Sheet (4) | [d 1] | 0.800 | 1.034 | 0.101 | 10.471 |
| Anisotropically Conductive Sheet (5) | [e 1] | 0.614 | 0.732 | 0.090 | 8.543 |
| Anisotropically Conductive Sheet (6) | [f 1] | 0.173 | 0.300 | 0.050 | 15.424 |
| Anisotropically Conductive Sheet (7) Reference | [g 1] | 0.185 | 0.301 | 0.045 | 23.154 |
| Anisotropically Conductive Sheet (8) | [a 2] | 6.374 | 10.521 | 3.113 | 123.551 |
| Anisotropically Conductive Sheet (9) | [b 2] | 0.733 | 1.324 | 0.090 | 6.338 |

TABLE 4

| Kind of Conductive | Average Value of Electric Resistance (Ω) | | | |
|---|---|---|---|---|
| Composite Metal Particles | Compressive Rate 5% | Compressive Rate 10% | Compressive Rate 15% | Compressive Rate 20% |
| Invention | | | | |
| Anisotropically Conductive Sheet (1) | [a 1] | 0.185 | 0.175 | 0.173 | 0.169 |
| Anisotropically Conductive Sheet (2) Comparative | [b 1] | 0.385 | 0.203 | 0.181 | 0.177 |
| Anisotropically Conductive Sheet (3) | [c 1] | 1.976 | 1.151 | 0.736 | 0.478 |
| Anisotropically Conductive Sheet (4) | [d 1] | 5.267 | 2.839 | 1.307 | 0.811 |
| Anisotropically Conductive Sheet (5) | [e 1] | 3.875 | 1.815 | 0.934 | 0.623 |
| Anisotropically Conductive Sheet (6) | [f 1] | 6.541 | 2.012 | 0.714 | 0.179 |
| Anisotropically Conductive Sheet (7) | [g 1] | 9.131 | 3.747 | 1.002 | 0.191 |

TABLE 4-continued

|  | Kind of Conductive | Average Value of Electric Resistance (Ω) | | | |
| --- | --- | --- | --- | --- | --- |
|  | Composite Metal Particles | Compressive Rate 5% | Compressive Rate 10% | Compressive Rate 15% | Compressive Rate 20% |
| Reference | | | | | |
| Anisotropically Conductive Sheet (8) | [a 2] | 31.070 | 21.570 | 10.260 | 6.472 |
| Anisotropically Conductive Sheet (9) | [b 2] | 3.504 | 1.432 | 0.938 | 0.801 |

EFFECT OF THE INVENTION

As described above, according to the conductive metal particles and conductive composite metal particles of the present invention, conductive materials having stable conductivity can be provided.

The conductive paste compositions according to the present invention have high conductivity and are high in reproductivity thereof because the above-described conductive metal particles and/or conductive composite metal particles are contained.

The conductive sheets according to the present invention have high conductivity and are high in reproductivity thereof because the above-described conductive metal particles and/or conductive composite metal particles are contained.

The circuit boards according to the present invention have high conductivity between wiring layers and are high in reproductivity thereof because they have a conductor containing the above-described conductive metal particles and/or conductive composite metal particles.

According to the conductive connection structures of the present invention, electrical connection high in conductivity and the reproductivity thereof can be achieved because they are connected by the above-described conductive paste composition or through the above-described conductive sheet.

According to the electrical inspection apparatus of the present invention for circuit devices, electrical connection high in conductivity and the reproductivity thereof can be achieved to a circuit device which is an inspection target because the apparatus have the above-described conductive sheet.

What is claimed is:

1. Conductive composite metal particles obtained by coating the surfaces of conductive metal particles with a high-conductive metal, wherein the conductive metal articles are formed from a metallic material selected from the group consisting of iron, nickel, cobalt and alloys thereof, having a number average particle diameter of 5 to 100 μm a BET specific surface area of $0.01 \times 10^3$ to $0.7 \times 10^3$ m²/kg, a sulfur element content of at most 0.1% by mass, an oxygen element content of at most 0.5% by mass and a carbon element content of at most 0.1% by mass, and wherein the coefficient of variation of the particle diameter is at most 50%, and the saturation magnetization of the particles is at least 0.1 Wb/m².

2. The conductive composite metal particles according to claim 1, wherein the thickness t of the coating layer of the high-conductive metal, which is calculated out in accordance with the following numerical expression, is at least 10 nm:

$$t=[1/(Sw \cdot \rho)] \times [N/(1-N)]$$

wherein t is the thickness (nm) of the coating layer of the high-conductive metal, Sw is the BET specific surface area (m2/kg) of the conductive metal particles, ρ is a specific gravity (kg/m³) of the high-conductive metal, and N is a ratio of a weight of the coating layer of the high-conductive metal to a weight of the conductive composite metal particles.

3. The conductive composite metal particles according to claim 2, wherein the high-conductive metal is gold.

4. The conductive composite metal particles according to claim 2, wherein the content of the high-conductive metal in each surface layer portion of the conductive composite metal particles is at least 50% by mass.

5. The conductive composite metal particles according to claim 2, wherein the ET specific surface area of the conductive composite metal particles is $0.01 \times 10^3$ to $0.7 \times 10^3$ m²/kg.

6. The conductive composite metal particles according to claim 5, wherein the electric resistance value R as measured in the following manner is at most 1 Ω:

Electric resistance value:

A paste composition is prepared by kneading 0.6 g of the conductive composite metal particles with 0.8 g of liquid rubber, the paste composition is arranged between a pair of electrodes each having a diameter of 1 mm and arranged so as to be opposed to each other at a clearance of 0.5 mm, a magnetic field of 0.3 T is applied to this pair of electrodes, and the pair of electrodes are left to stand in this state until the electric resistance value between the pair of electrodes is stabilized, thereby measuring an electric resistance value at this time.

7. The conductive composite metal particles according to claim 2, wherein the electric resistance value R as measured in the following manner is at most 1 Ω:

Electric resistance value:

A paste composition is prepared by kneading 0.6 g of the conductive composite metal particles with 0.8 g of liquid rubber, the paste composition is arranged between a pair of electrodes each having a diameter of 1 mm and arranged so as to be opposed to each other at a clearance of 0.5 mm, a magnetic field of 0.3 T is applied to this pair of electrodes, and the pair of electrodes are left to stand in this state until the electric resistance value between the pair of electrodes is stabilized, thereby measuring an electric resistance value at this time.

8. The conductive composite metal particles according to claim 3, wherein the electric resistance value R as measured in the following manner is at most 1 Ω:

Electric resistance value:

A paste composition is prepared by kneading 0.6 g of the conductive composite metal particles with 0.8 g of liquid rubber, the paste composition is arranged between a pair of electrodes each having a diameter of 1 mm and arranged so as to be opposed to each other at a clearance of 0.5 mm, a magnetic field of 0.3 T is applied to this pair of electrodes, and the pair of electrodes are left to stand in this state until the electric resistance value between the pair of electrodes is stabilized, thereby measuring an electric resistance value at this time.

9. The conductive composite metal particles according to claim 4, wherein the electric resistance value R as measured in the following manner is at most 1 Ω:

Electric resistance value:

A paste composition is prepared by kneading 0.6 g of the conductive composite metal particles with 0.8 g of liquid rubber, the paste composition is arranged between a pair of electrodes each having a diameter of 1 mm and arranged so as to be opposed to each other at a clearance of 0.5 mm, a magnetic field of 0.3 T is applied to this pair of electrodes, and the pair of electrodes are left to stand in this state until the electric resistance value between the pair of electrodes is stabilized, thereby measuring an electric resistance value at this time.

* * * * *